United States Patent
Feilchenfeld et al.

(10) Patent No.: US 8,114,750 B2
(45) Date of Patent: Feb. 14, 2012

(54) LATERAL DIFFUSION FIELD EFFECT TRANSISTOR WITH DRAIN REGION SELF-ALIGNED TO GATE ELECTRODE

(75) Inventors: Natalie B. Feilchenfeld, Jericho, VT (US); Jeffrey P. Gambino, Westford, VT (US); Xuefeng Liu, South Burlington, VT (US); Benjamin T. Voegeli, Burlington, VT (US); Steven H. Voldman, South Burlington, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 618 days.

(21) Appl. No.: 12/104,643

(22) Filed: Apr. 17, 2008

(65) Prior Publication Data

US 2009/0261426 A1    Oct. 22, 2009

(51) Int. Cl.
*H01L 21/00* (2006.01)
(52) U.S. Cl. .................. 438/336; 438/286; 438/316
(58) Field of Classification Search .................. 438/286, 438/316, 336
See application file for complete search history.

(56) References Cited

U.S. PATENT DOCUMENTS

| | | | | |
|---|---|---|---|---|
| 5,237,193 A * | 8/1993 | Williams et al. | ............. | 257/336 |
| 5,306,656 A * | 4/1994 | Williams et al. | ............. | 438/283 |
| 5,517,046 A * | 5/1996 | Hsing et al. | ............. | 257/336 |
| 5,705,439 A * | 1/1998 | Chang | ............. | 438/286 |
| 5,920,103 A * | 7/1999 | Fulford et al. | ............. | 257/408 |
| 5,923,983 A * | 7/1999 | Fulford et al. | ............. | 438/287 |
| 5,926,714 A * | 7/1999 | Gardner et al. | ............. | 438/303 |
| 5,998,274 A * | 12/1999 | Akram et al. | ............. | 438/306 |
| 6,017,802 A * | 1/2000 | Gardner et al. | ............. | 438/303 |
| 6,078,080 A * | 6/2000 | Kadosh et al. | ............. | 257/344 |
| 6,124,610 A * | 9/2000 | Cheek et al. | ............. | 257/328 |
| 6,140,183 A * | 10/2000 | Osanai | ............. | 438/268 |
| 6,252,278 B1 * | 6/2001 | Hsing | ............. | 257/335 |
| 6,388,298 B1 * | 5/2002 | Gardner et al. | ............. | 257/408 |
| 6,475,870 B1 * | 11/2002 | Huang et al. | ............. | 438/316 |
| 6,518,138 B2 * | 2/2003 | Hsing | ............. | 438/306 |
| 6,770,951 B2 * | 8/2004 | Huang et al. | ............. | 257/557 |
| 7,067,876 B2 * | 6/2006 | Yasuhara et al. | ............. | 257/335 |
| 7,238,986 B2 * | 7/2007 | Pendharkar et al. | ............. | 257/336 |
| 7,514,329 B2 * | 4/2009 | Pendharkar et al. | ............. | 438/286 |
| 7,709,924 B2 * | 5/2010 | Voldman | ............. | 257/490 |

(Continued)

OTHER PUBLICATIONS

A.W. Ludikhuize, "High-Voltage DMOS and PMOS in Analog IC's", 1982 IEEE, Philips Research Laboratories, Eindhoven—The Netherlands.

*Primary Examiner* — Laura Menz
(74) *Attorney, Agent, or Firm* — Scully, Scott, Murphy & Presser, P.C.; Richard M. Kotulak, Esq.

(57) ABSTRACT

A disposable structure displaced from an edge of a gate electrode and a drain region aligned to the disposable structure is formed. Thus, the drain region is self-aligned to the edge of the gate electrode. The disposable structure may be a disposable spacer, or alternately, the disposable structure may be formed simultaneously with, and comprise the same material as, a gate electrode. After formation of the drain regions, the disposable structure is removed. The self-alignment of the drain region to the edge of the gate electrode provides a substantially constant drift distance that is independent of any overlay variation of lithographic processes.

12 Claims, 25 Drawing Sheets

U.S. PATENT DOCUMENTS

| | | | |
|---|---|---|---|
| 7,829,945 B2 * | 11/2010 | Adkisson et al. | 257/335 |
| 2001/0009790 A1 * | 7/2001 | Hsing | 438/286 |
| 2002/0167047 A1 * | 11/2002 | Yasuhara et al. | 257/341 |
| 2003/0040160 A1 * | 2/2003 | Huang et al. | 438/316 |
| 2008/0054355 A1 * | 3/2008 | Jang | 257/343 |
| 2008/0135903 A1 * | 6/2008 | Hu | 257/296 |
| 2008/0203490 A1 * | 8/2008 | Feilchenfeld et al. | 257/370 |
| 2009/0032850 A1 * | 2/2009 | Alter | 257/288 |
| 2009/0090980 A1 * | 4/2009 | King et al. | 257/408 |
| 2009/0108347 A1 * | 4/2009 | Adkisson et al. | 257/339 |
| 2009/0194785 A1 * | 8/2009 | Lu et al. | 257/139 |
| 2009/0250762 A1 * | 10/2009 | Liu et al. | 257/369 |
| 2009/0261426 A1 * | 10/2009 | Feilchenfeld et al. | 257/408 |

* cited by examiner

LATERAL DIFFUSION FIELD EFFECT TRANSISTOR WITH DRAIN REGION SELF-ALIGNED TO GATE ELECTRODE

FIELD OF THE INVENTION

The present invention relates to semiconductor structures, and particularly to lateral diffusion metal-oxide-semiconductor field effect transistors (LDMOSFETs) having a drain region that is self-aligned to a gate electrode to provide a constant drift distance, and consequently, a constant drift region resistance, and methods of manufacturing the same.

BACKGROUND OF THE INVENTION

A lateral diffusion metal-oxide-semiconductor field effect transistor (LDMOSFET) is a field effect transistor having a drift region between a gate and a drain region in order to avoid a high electric field at a drain junction, i.e., at the p-n junction between a body and the drain region. An LDMOSFET is typically employed in high voltage power applications involving voltages in the range from about 5 V to about 50 V, which is applied across the drain region and the source region. A substantial fraction of the high voltage may be consumed within the drift region in the LDMOSFET so that the electric field generated across the gate dielectric does not cause breakdown of the gate dielectric.

A thin gate dielectric is preferred on the source side of a gate electrode to apply a strong electric field to induce current flow, while a thick gate dielectric is preferred on the drain side of the gate electrode to prevent an excessive electric field across the gate oxide in the LDMOSFET. Methods of employing a thicker oxide on the drain side relative to the source side have been known in the art.

Referring to FIG. 1, an exemplary prior art LDMOSFET structure is shown, which comprises a substrate semiconductor region 110 containing a semiconductor material and having a doping of a first conductivity type and located in a semiconductor substrate 108. Typically, the dopant concentration of the substrate semiconductor region is low, i.e., from about $3.0 \times 10^{14}/cm^3$ to about $1.0 \times 10^{16}/cm^3$. A first conductivity type well 130 located in the semiconductor substrate 108 comprises the same semiconductor material as the substrate semiconductor region 110. The first conductivity type well 130 has a doping of the first conductivity type and has a dopant concentration higher than the doping concentration of the substrate semiconductor region 130. A LOCOS (local oxidation of silicon) oxide 150 is present on a portion of a top surface of the semiconductor substrate 108. The LOCOS oxide 150 has two bird's beaks and is integrally formed with a thin silicon oxide layer that is adjoined to one of the bird's beaks. A drift region 140 having a doping of a second conductivity type, which is the opposite of the first conductivity type, is located directly beneath a portion of the LOCOS oxide 150 within the semiconductor substrate 108. The drift region 140 comprises the same semiconductor material as the substrate semiconductor region 110.

A source region 142 and a drain region 144, each comprising a semiconductor material and having a doping of the second conductivity type, are located within the first conductivity type well 130 and the drift region 140, respectively. A substrate contact semiconductor region 132 comprising the semiconductor material and having a doping of the first conductivity type is also formed in the first conductivity type well 130 at a location farther away from the drift region 140 than the first conductivity type well 130. A source and substrate metal contact 182 is located on the source region 142 and the substrate contact semiconductor region 132. Likewise, a drain metal contact 184 is located on the drain region 184. A gate electrode 160 straddles a portion of the first conductivity type well 130 and the drift region 140. Optionally, a portion of the substrate semiconductor region 110 may abut a portion of the LOCOS oxide. A gate spacer 162 and a gate metal contact 186 are located on the gate electrode 160. LOCOS isolation 120 provides electrical isolation between various components on the surface of the semiconductor substrate 108.

Local oxidation of silicon (LOCOS) process employs a silicon substrate having a patterned oxygen-diffusion-resistant layer thereupon. Typically, the oxygen-diffusion-resistant layer is a silicon nitride layer. During a thermal oxidation process, exposed portions of the silicon substrate are thermally oxidized to form thermal silicon oxide. As oxygen atoms diffuse underneath the edge of the oxygen-diffusion-resistant layer, a tapered silicon oxide structure having a concave curvature known as a bird's beak is formed underneath the oxygen-diffusion-resistant layer. Formation of the bird's beak thus requires presence of the oxygen-diffusion-resistant layer. The LOCOS oxide 150 in the exemplary prior art semiconductor LDMOSFET structure is formed prior to formation of the gate electrode 160 by forming a patterned oxygen-diffusion-resistant layer, e.g., a silicon nitride layer, and performing a thermal oxidation of silicon.

For the LOCOS process, the gate electrode 160 is formed after the formation of the LOCOS oxide 150. Patterning of the gate electrode 160 is performed on a preexisting LOCOS oxide 150. The location of the bird's beak structure relative to the gate electrode 160 is subject to overlay variations of the alignment of the lithographic pattern of the gate electrode and the lithographic pattern of the oxygen-diffusion-resistant layer. Thus, it is inherent in the exemplary prior art LDMOSFET structure that the thickness profile of the LOCOS oxide 150, which is a gate oxide, is not self-aligned to an edge of the gate electrode 160, and as a consequence, performance of the exemplary prior art LDMOSFET has significant variations in terms of response of drain current as a function of a gate voltage.

The drain region 144 and the gate electrode 160 require separate lithographic steps for patterning. Thus, the drift distance L' between the edge of the drift region underneath the gate electrode 160 and the proximal edge of the drain region 144 is subject to variation due to the lithographic overlay tolerance between the pattern for the drain region 144 and the pattern for the gate electrode 160. The variation in the overlay distance L' introduces variation in the electrical resistance of the drift region 140. However, a high resistance of the drift region 140 is undesirable because current flow through the drift region 140 is impeded by such a high resistance.

Referring to FIG. 2, another prior art LDMOSFET structure disclosed by A. W. Ludikhuize, "High-Voltage DMOS and PMOS in Analog IC's," IEDM 1982, pp. 81-84, comprises a gate dielectric 172 having multiple thicknesses. The body 132, which has a doping of a first conductivity type, laterally abuts the drift region 142, which has a doping of the second conductivity type, at an interface directly below the gate dielectric 172. The gate dielectric 172 has stepwise increases in thickness in the direction from an edge of a gate electrode 182 over the body 132 toward an edge of the gate electrode 182 over the drift region 142. A source region 152 and a drain region 162 are formed in distal ends of the body 132 and the drift region 142, respectively. The stepwise increase in the thickness of the gate dielectric 172 reduces electric field across the gate dielectric 172 near the edge of the gate electrode 182 over the drift region 142. The reduction in the electric field is beneficial to the integrity of the gate dielectric 172, especially in an off-state when a high voltage is applied across the portion of the gate dielectric 172 directly below the edge of the gate electrode 182 and over the drift region 142.

The portion of the gate electrode 182 which is over the drift region 142 is generally referred to as a "field plate." While this example depicts the field plate as a portion of the gate electrode 182, it is sometimes formed as a distinct region which can be biased independently, but is generally biased at the same potential as the gate or source. In the case that the LDMOSFET is an n-type device, in an off-state, the gate electrode 182 and the source 152 are generally at approximately the same potential as the body 132, while the drain 162 is at a higher potential. An electric field exists laterally across the drift region 142, with the highest potential at the distal end near the drain 162, and the lowest magnitude potential at the proximal end near the body 132. An electric field also exists across the junction between drift region 142 and body 132. The electric field between gate electrode 182 and the drift region 142 causes an increased depletion of majority carriers in the drift region 142 below the gate electrode 182. This serves to reduce the electric field near the surface at the interface between the drift region 142 and the body 132, thereby increasing the effective breakdown voltage of the junction. For this reason, this type of device is termed "reduced surface field metal-oxide-semiconductor field effect transistor," or RESURF MOSFET.

In the present example, when the device is on, the gate electrode 182 is generally at a higher potential than the source 152 and the body 132, while the potential of the drain 162 is often at approximately the same potential as the source 152 and the body 132. In this case, the resulting electric field between the gate electrode 182 and the drift region 142 causes an accumulation of majority carriers in the drift region 142, thus reducing the effective resistance of the drift region in the on-state, or "on-resistance." As such, the addition of a field plate by extending the gate electrode over the drift region 142 provides a device which has an increased breakdown voltage between the body 132 and the drift region 142, yet has reduced on-resistance.

Here, the drift distance L' is the distance between the edge of the drift region 142 underneath the gate electrode 182 and the proximal edge of the drain region 162. This drift distance L' is also subject to variation due to the lithographic overlay tolerance between the pattern for the drain region 162 and the pattern for the gate electrode 182 since the gate electrode 182 and the drain region 162 are patterned in separate lithographic steps. The variation in the overlay distance L' introduces variation in the electrical resistance of the drift region 142.

Typically, in order to minimize the electric field in the off-state of an LDMOSFET, the drift region is lightly doped and thus has a high resistance. However, the high resistance is undesirable in an on-state since the performance and efficiency is limited by the high resistance of the drift region. Reduction of on-resistance of the drift region generally comes at the expense of decreased breakdown voltage and device reliability, thus limiting the allowable operating voltage. Increase of resistance of the drift region results in an increase in the operating voltage at the expense of reduced performance and efficiency.

Thus, in order to provide a high performance and/or low power LDMOSFET, it is necessary to provide a tight control over the resistance of the drift region. Such tight control may be facilitated by a tight control over a drift distance, which is the distance between the edge of a drift region under an electrode and a proximal edge of a drain region.

In view of the above, there exists a need for an LDMOSFET structure providing a well controlled resistance for a drift region independent of overlay variations in lithographic steps of a manufacturing sequence, and methods of manufacturing the same.

Particularly, there exists a need for an LDMOSFET structure in which the drift distance is independent of overlay variations in lithographic steps of a manufacturing sequence, and methods of manufacturing the same.

SUMMARY OF THE INVENTION

The present invention addresses the needs described above by providing LDMOFET structures having a drain region that is self-aligned to an edge of a gate electrode, and methods of manufacturing the same. The self-alignment of the drain region to the edge of the gate electrode provides a constant drift distance, and subsequently, a constant drift region resistance irrespective of overlay variations that are inherently present in a semiconductor manufacturing sequence.

In the present invention, a disposable structure displaced from an edge of a gate electrode and a drain region aligned to the disposable structure is formed. Thus, the drain region is self-aligned to the edge of the gate electrode. In one embodiment, the disposable structure is a disposable spacer. In another embodiment, the disposable structure is formed simultaneously with, and comprises the same material as, a gate electrode. After formation of the drain regions, the disposable structure is removed. The self-alignment of the drain region to the edge of the gate electrode provides a substantially constant drift distance that is independent of any overlay variation of lithographic processes.

According to an aspect of the present invention, a method manufacturing a semiconductor structure is provided, which comprises:

forming a gate dielectric and a gate electrode on a semiconductor substrate;

forming a first gate spacer directly on the gate electrode;

forming a second gate spacer directly on the first gate spacer;

removing a first portion of the second gate spacer on a source side of the gate electrode;

forming a source region in the semiconductor substrate on the source side of the gate electrode after removal of the first portion of the second gate spacer;

forming a drain region in the semiconductor substrate on a drain side of the gate electrode; and removing a second portion of the second gate spacer on the drain side of the gate electrode after formation of the drain region.

In one embodiment, an edge of the source region is substantially coincident with an outer sidewall of the first gate spacer.

In another embodiment, an edge of the drain region is substantially coincident with a first outer sidewall of the second gate spacer.

In even another embodiment, the method further comprises forming a dielectric cap directly on the gate electrode, wherein the dielectric cap and the gate electrode have vertically coincident sidewalls.

In yet another embodiment, the second gate spacer is formed on directly on the dielectric cap, and wherein the dielectric cap comprises borophosphosilicate glass (BPSG).

In still another embodiment, the second gate spacer comprises a material selected from germanium, a silicon germanium alloy containing germanium at an atomic concentration of 25% or greater, an anti-reflective coating material, and silicon oxide containing hydrogen at an atomic concentration of 1.0% or greater.

In a further embodiment, the method further comprises:

forming a first conductivity type well having a doping of a first conductivity type underneath a source side edge of the gate electrode in the semiconductor substrate, wherein the first conductivity type well abuts the gate dielectric, wherein the source region is formed in the first conductivity type well and has a doping of the second conductivity type; and forming a drift region having a doping of a second conductivity type underneath a drain side edge of the gate electrode in the semiconductor substrate, wherein the drift region abuts the gate dielectric, wherein the second conductivity type is the opposite of the first conductivity type, and wherein the drain region is formed within the drift region and has a doping of the second conductivity type.

In a yet further embodiment, the method further comprises forming a substrate contact semiconductor region having a doping of the first conductivity type in the semiconductor substrate, wherein an edge of the substrate contact semiconductor region is substantially coincident with a second outer sidewall of the second gate spacer.

In a still further embodiment, a first lateral distance between the substrate contact semiconductor region and the gate electrode is the same as a second lateral distance between the drain region and the gate electrode.

In further another embodiment, the method further comprises forming a source and substrate metal contact directly on said source region and said substrate contact semiconductor region.

According to another aspect of the present invention, another method manufacturing a semiconductor structure is provided, which comprises:

forming a gate dielectric and a gate electrode material layer on a semiconductor substrate;

forming a gate electrode and a disposable conductive portion disjoined from the gate electrode by patterning the gate electrode material layer;

forming a dielectric gate spacer directly on sidewalls of the gate electrode and the disposable conductive portion, wherein the dielectric gate spacer contains two holes laterally enclosing the gate electrode and the disposable conductive portion; and forming a source region and a drain region in the semiconductor substrate, wherein an edge of the source region is substantially vertically coincident with an outer sidewall of a first portion of the dielectric gate spacer laterally abutting the gate electrode, and wherein an edge of the drain region is substantially vertically coincident with an outer sidewall of a second portion of the dielectric gate spacer laterally abutting the disposable conductive portion.

In one embodiment, the dielectric gate spacer is of unitary construction and comprises the first portion, the second portion, and a third portion, wherein the first portion laterally abuts the gate electrode and does not abut the disposable conductive portion, the second portion laterally abuts the disposable conductive portion and does not abut the gate electrode, and a third portion laterally abuts the gate electrode and the disposable conductive portion.

In another embodiment, a lateral distance between the electrode and the disposable conductive portion is less than twice a lateral width of the first portion as measured at a bottom of the first portion.

In even another embodiment, the method further comprises:

lithographically masking the gate electrode with a photoresist, while exposing the disposable conductive portion; and removing the disposable conductive portion, while preserving the gate electrode.

In yet another embodiment, the method further comprises forming a drift region underneath an opening formed by removal of the disposable conductive portion by implanting dopant ions into the opening.

In still another embodiment, the method further comprises forming a first conductivity type well having a doping of a first conductivity type underneath a source side edge of the gate electrode in the semiconductor substrate, wherein the first conductivity type well abuts the gate dielectric, wherein the source region is formed in the first conductivity type well and has a doping of the second conductivity type, wherein the drift region has a doping of a second conductivity type which is the opposite of the first conductivity type, wherein the drift region laterally abuts the drain region, and wherein the source region and the drain region have a doping of the second conductivity type.

In still yet another embodiment, the method further comprises forming a substrate contact semiconductor region having a doping of the first conductivity type in the semiconductor substrate, wherein the substrate contact semiconductor region laterally abuts the source region.

In further another embodiment, the method further comprises forming a source and substrate metal contact directly on said source region and said substrate contact semiconductor region.

According to yet another aspect of the present invention, a semiconductor structure is provided, which comprises:

a first conductivity type well having a doping of a first conductivity type and located in a semiconductor substrate;

a drift region having a doping of a second conductivity type which is the opposite of the first conductivity type, and located in the semiconductor substrate;

a gate dielectric vertically abutting the first conductivity type well and the drift region;

a gate electrode vertically abutting the gate dielectric and straddling over the first conductivity type well and the drift region; and a dielectric gate spacer of unitary construction and containing two holes, wherein a first hole is filled by the gate electrode, and wherein a second hole is filled with a dielectric material.

In one embodiment, the semiconductor structure further comprises:

a source region having a doping of the second conductivity type and located in the first conductivity type well;

a drain region having a doping of the second conductivity type, laterally abutting the drift region, and located in the semiconductor substrate;

In another embodiment, an edge of the source region is substantially vertically coincident with a first outer sidewall of the dielectric gate spacer overlying the first conductivity type well, and wherein an edge of the drain region is substantially vertically coincident with a second outer sidewall of the dielectric gate spacer overlying the drift region.

In even another embodiment, the drift region laterally abuts the first conductivity type well.

In yet another embodiment, the semiconductor structure further comprises:

a substrate contact semiconductor region having a doping of the first conductivity type and located in the semiconductor substrate, wherein the substrate contact semiconductor region laterally abuts the source region; and a substrate layer having a doping of the first conductivity type, abutting the first conductivity type well and the drift region, located in the semiconductor substrate, and having a lower doping concentration than the first conductivity type well.

In further another embodiment, the semiconductor structure further comprises a source and substrate metal contact vertically abutting said source region and said substrate contact semiconductor region.

According to still another aspect of the present invention, another semiconductor structure is provided, which comprises:

a first conductivity type well having a doping of a first conductivity type and located in a semiconductor substrate;

a drift region having a doping of a second conductivity type which is the opposite of the first conductivity type, laterally abutting the first conductivity type well, and located in the semiconductor substrate;

a drain region having a doping of the second conductivity type, laterally abutting the drift region, and located in the semiconductor substrate;

a substrate contact semiconductor region having a doping of the first conductivity type and located in the semiconductor substrate;

a gate dielectric vertically abutting the first conductivity type well and the drift region; and a gate electrode vertically abutting the gate dielectric and straddling over the first conductivity type well and the drift region, wherein a first lateral distance between the substrate contact semiconductor region and the gate electrode is substantially the same as a second lateral distance between the drain region and the gate electrode.

In one embodiment, the semiconductor structure further comprises a source region having a doping of the second conductivity type and located in the first conductivity type well, wherein the substrate contact semiconductor region laterally abuts the source region.

In another embodiment, the semiconductor structure further comprises a source and substrate metal contact vertically abutting said source region and said substrate contact semiconductor region.

In even another embodiment, the drift region laterally abuts the first conductivity type well.

DETAILED DESCRIPTION OF THE INVENTION

Figure 1:
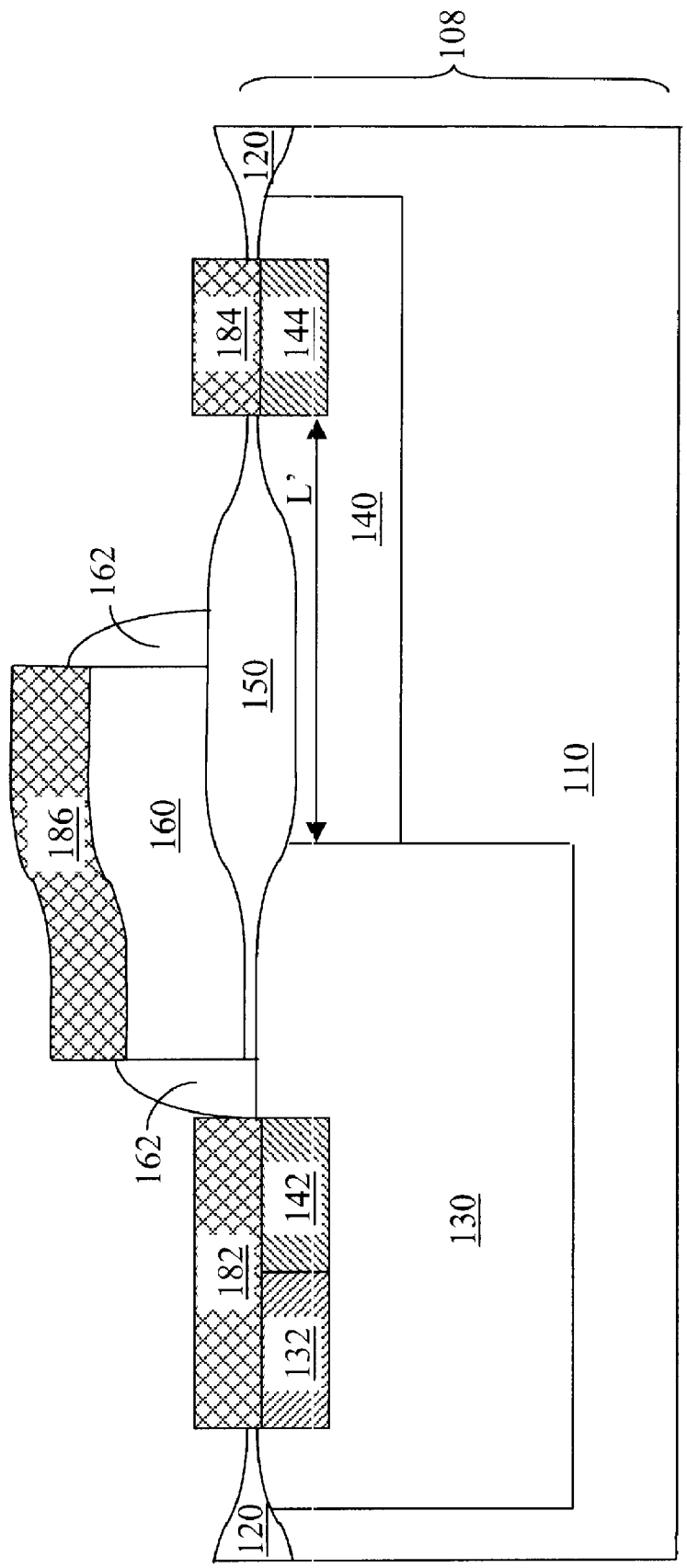
FIG. 1 is a vertical cross-sectional view of an exemplary prior art lateral diffusion metal-oxide-semiconductor field effect transistor (LDMOSFET) employing a LOCOS oxide for the gate dielectric.
Figure 2:
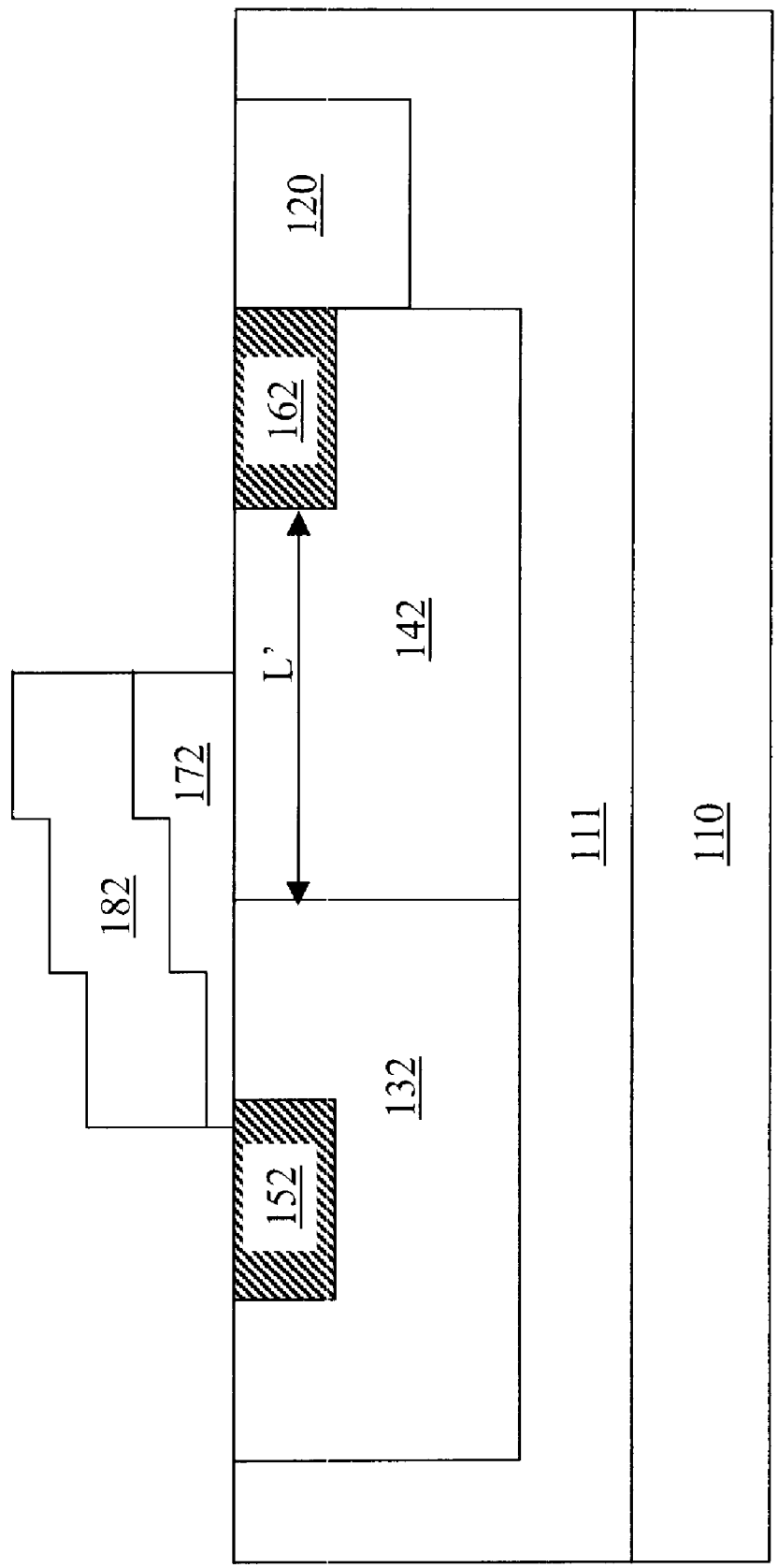
FIG. 2 is a vertical cross-sectional view of another exemplary prior art lateral diffusion metal-oxide-semiconductor field effect transistor (LDMOSFET), which is a reduced surface field metal-oxide-semiconductor field effect transistor, in which a LOCOS oxide is employed for the gate dielectric.

As stated above, the present invention relates to lateral diffusion metal-oxide-semiconductor field effect transistors (LDMOSFETs) having a drain region that is self-aligned to a gate electrode to provide a constant drift distance, and consequently, a constant drift region resistance, and methods of manufacturing the same, which are now described in detail with accompanying figures. It is noted that like and corresponding elements are referred to by like reference numerals.

Figure 3:
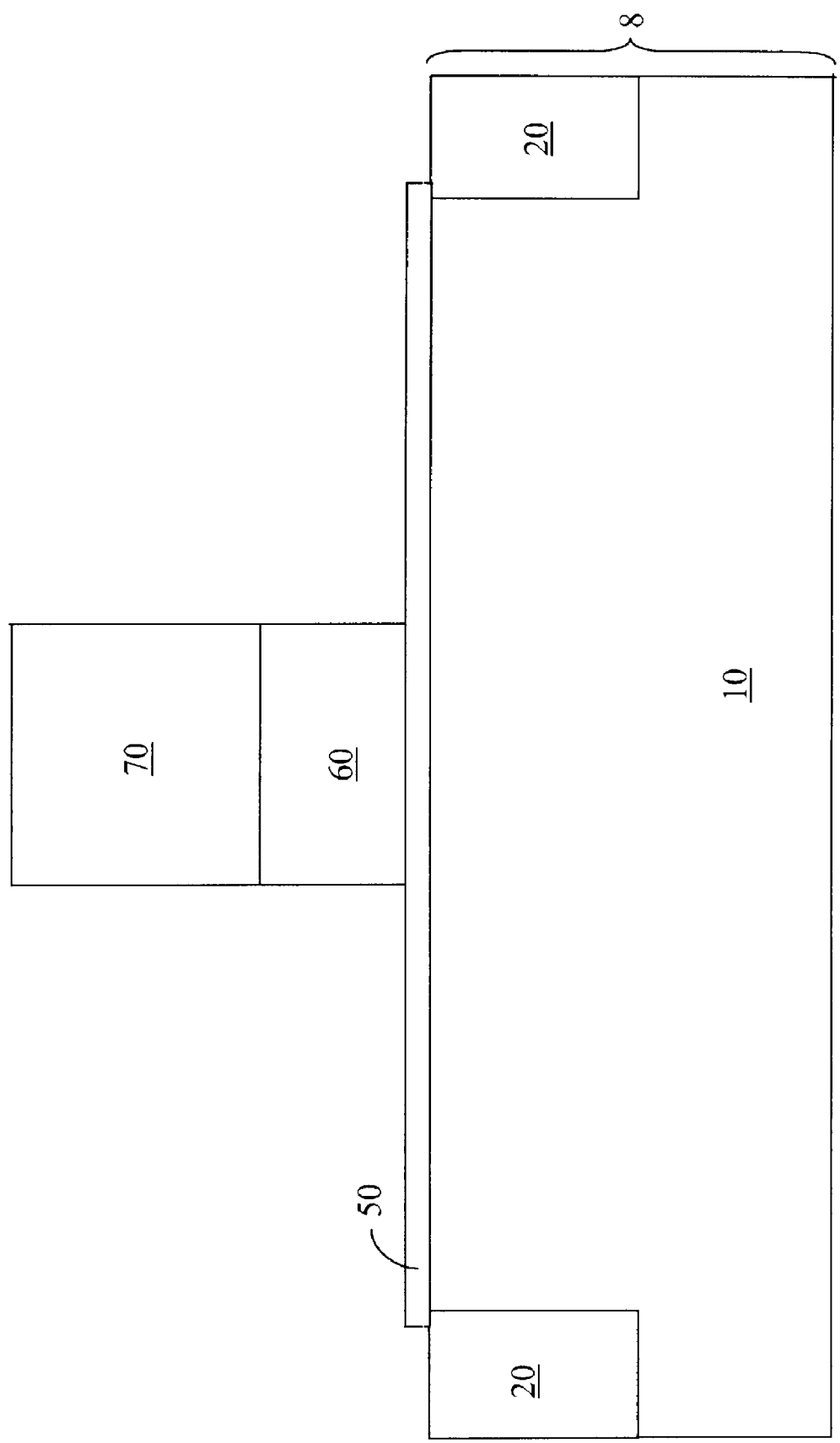
FIGS. 3-11 are sequential vertical cross-sectional views of a first exemplary semiconductor structure according to a first embodiment of the present invention.

Referring to FIG. 3, a first exemplary structure according to a first embodiment of the present invention comprises a semiconductor substrate 8 containing a substrate semiconductor region 10 and shallow trench isolation regions 20. The substrate semiconductor region 10 comprises a semiconductor material. For example, the substrate semiconductor region may comprise a first silicon containing material such as silicon, a silicon germanium alloy, a silicon carbon alloy, or a silicon germanium carbon alloy. The substrate semiconductor region 10 may have a p-type doping or an n-type doping at a typical dopant concentration from about $1.0 \times 10^{14}/cm^3$ to about $1.0 \times 10^{16}/cm^3$. The doping type of the substrate semiconductor region 10 is herein referred to as a first conductivity type. The shallow trench isolation regions 20 comprise a dielectric material, and are formed by methods well known in the art.

A gate dielectric 50 is formed on exposed surfaces of the semiconductor region 10. The gate dielectric 50 comprises an oxide-containing dielectric material, which may be silicon oxide, silicon nitride, or a stack of silicon oxide and a high-k gate dielectric material such as $HfO_2$, $ZrO_2$, $La_2O_3$, $Al_2O_3$, $TiO_2$, $SrTiO_3$, $LaAlO_3$, $Y_2O_3$, an alloy thereof, or a silicate thereof. The gate dielectric 50 has a uniform thickness. The thickness of the gate dielectric may be from about 1 nm to about 50 nm, and preferably from about 6 nm to about 20 nm, although lesser and greater thicknesses are also explicitly contemplated herein.

A stack of a gate electrode 60 and a dielectric cap 70 is formed on the gate dielectric 50 by deposition and lithographic patterning of a gate electrode material layer (not shown) and a dielectric cap material layer. The gate electrode 60 comprises a conductive material. Typically, the gate electrode comprises a second silicon containing material such as polysilicon, amorphous silicon, a polycrystalline silicon germanium alloy, a polycrystalline silicon carbon alloy, or a polycrystalline silicon germanium carbon alloy. The gate electrode 60 may be doped with dopants of the first conductivity type or a second conductivity type, which is the opposite of the first conductivity type. For example, if the first conductivity type is p-type, the second conductivity type is n-type and vice versa. The thickness of the gate electrode 60 may be from about 60 nm to about 400 nm, and preferably from about 100 nm to about 300 nm.

The etch process employed to pattern the gate electrode 60 may, or may not, be selective to the gate dielectric 50. If the etch process is selective to the gate dielectric 50, the gate dielectric 50 is preserved at this point as shown in FIG. 3. If the etch process is not selective to the gate dielectric 50, the gate dielectric 50 may be patterned to have sidewalls that are vertically coincident with sidewalls of the gate electrode 60.

The dielectric cap 70 comprises a dielectric material that may be removed selective to the shallow trench isolation regions 20 and the gate electrode 60. The material of the dielectric cap 70 may also be removed selective to either the gate dielectric 50 or the material of the substrate semiconductor region 10. For example, the shallow trench isolation structures 20 may comprise silicon oxide and the dielectric cap 70 may comprise borophosphosilicate glass (BPSG) so that the dielectric cap 70 is removed at a higher etch rate than the shallow trench isolation structures 20. Preferably, the dielectric cap 70 is removable at an etch rate that is at least one order of magnitude higher than the etch rate of the shallow trench isolation structure in at least one etch chemistry. The thickness of the dielectric cap 70 may be from about 100 nm to about 2,000 nm, and typically from about 300 nm to about 1,000 nm in this case.

Alternately, the dielectric cap 70 may comprise an oxide having a high hydrogen content so that the etch rate of the dielectric cap 70 is higher than the etch rate of the shallow trench isolation structures 20 which contain undoped silicate glass (USG). In this case, the hydrogen content of the dielectric cap is greater than about 1.0% in atomic concentration. In contrast, it is preferred that the hydrogen content of the undoped silicate glass (USG) is less than 0.1%. Yet alternately, the dielectric cap 70 may comprise germanium or a silicon germanium alloy containing germanium at an atomic concentration of 25% or greater so that the dielectric cap 70 may be subsequently removed selective to the shallow trench isolation regions 20. Still alternately, the dielectric cap 70 may comprise another dielectric material such as silicon nitride. The thickness of the dielectric cap 70 may be from about 100 nm to about 2,000 nm, and typically from about 300 nm to about 1,000 nm in the above cases.

Figure 4:
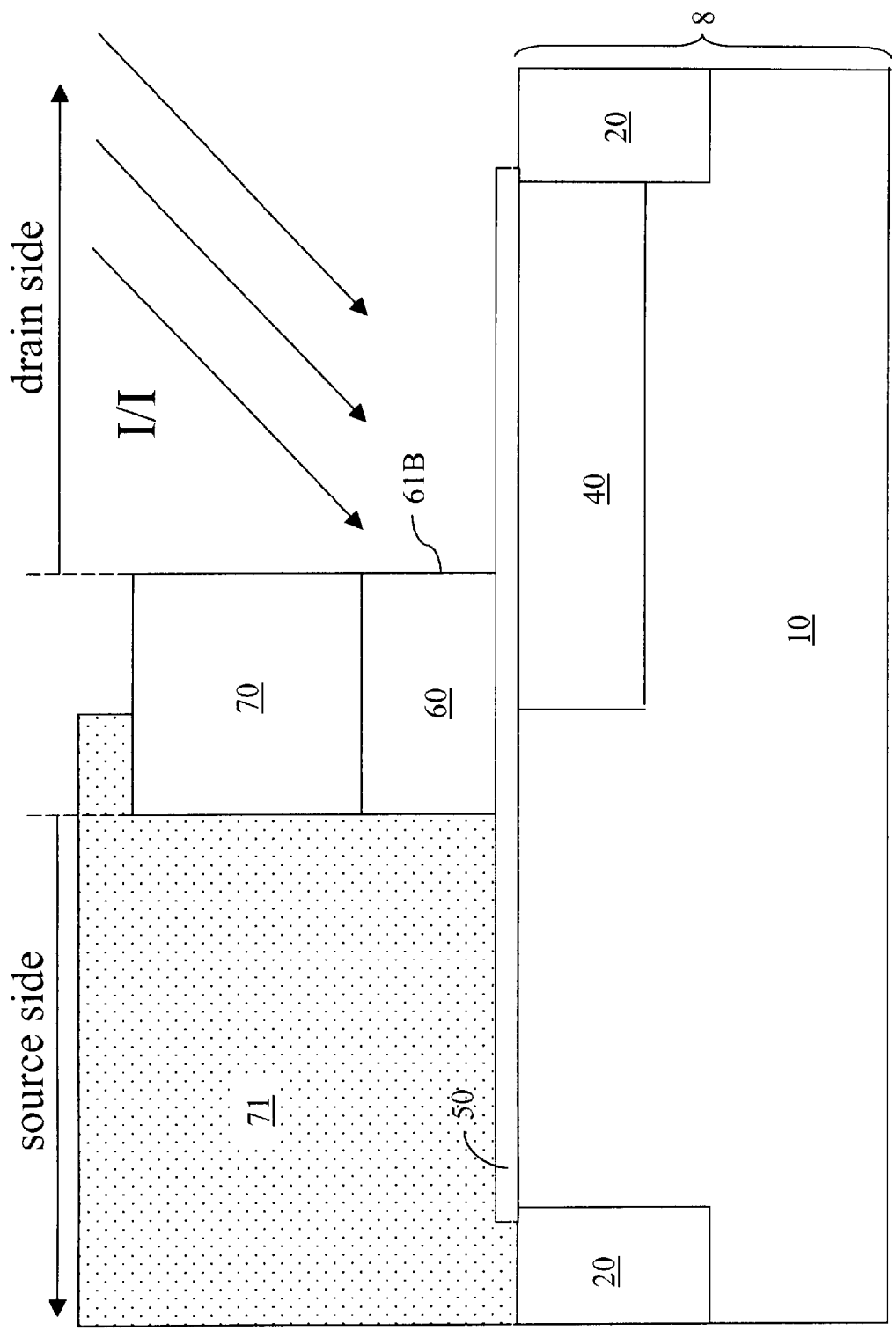

Referring to FIG. 4, a first photoresist 71 is applied over the semiconductor substrate and the stack of the gate electrode 60 and the dielectric cap 70 and lithographically patterned to cover a portion of the semiconductor substrate 8 on one side (to be subsequently referred to as a "source side") of the stack of the gate electrode 60 and the dielectric cap 70. If the gate dielectric 50 extends outside that area of the gate electrode 60, the portion of the gate dielectric 50 on the source side is also covered. Another portion of the semiconductor substrate 8 on an opposite side (to be subsequently referred to as a "drain side") of the stack of the gate electrode 60 and the dielectric cap 70.

Angled ion implantation of dopants of the second conductivity type is performed employing the first photoresist 71 and the stack of the gate electrode 60 and the dielectric cap 70 as an implantation mask to form a drift region 40 on the drain side. The drift region 40 vertically extends from the top surface of the semiconductor substrate 8 to a depth determined by the energy, species, and the angle of the ion implantation. Due to the non-orthogonal angle of the ion implantation, the drift region extends beneath the gate electrode 60. Thus, the sidewall of the gate electrode 60 on the drain side, or a "drain side gate electrode sidewall" 61B, is located above the drift region 40.

The drift region 40 has a dopant concentration from about $1.0 \times 10^{16}/cm^3$ to about $3.0 \times 10^{18}/cm^3$, and typically from about $3.0 \times 10^{16}/cm^3$ to about $1.0 \times 10^{18}/cm^3$, although lesser and greater dopant concentrations are also contemplated herein. Typical depths of the drift region 40 may be from about 50 nm to about 1,000 nm, and typically from about 100 nm to about 400 nm. The first photoresist 71 is subsequently removed.

Figure 5:
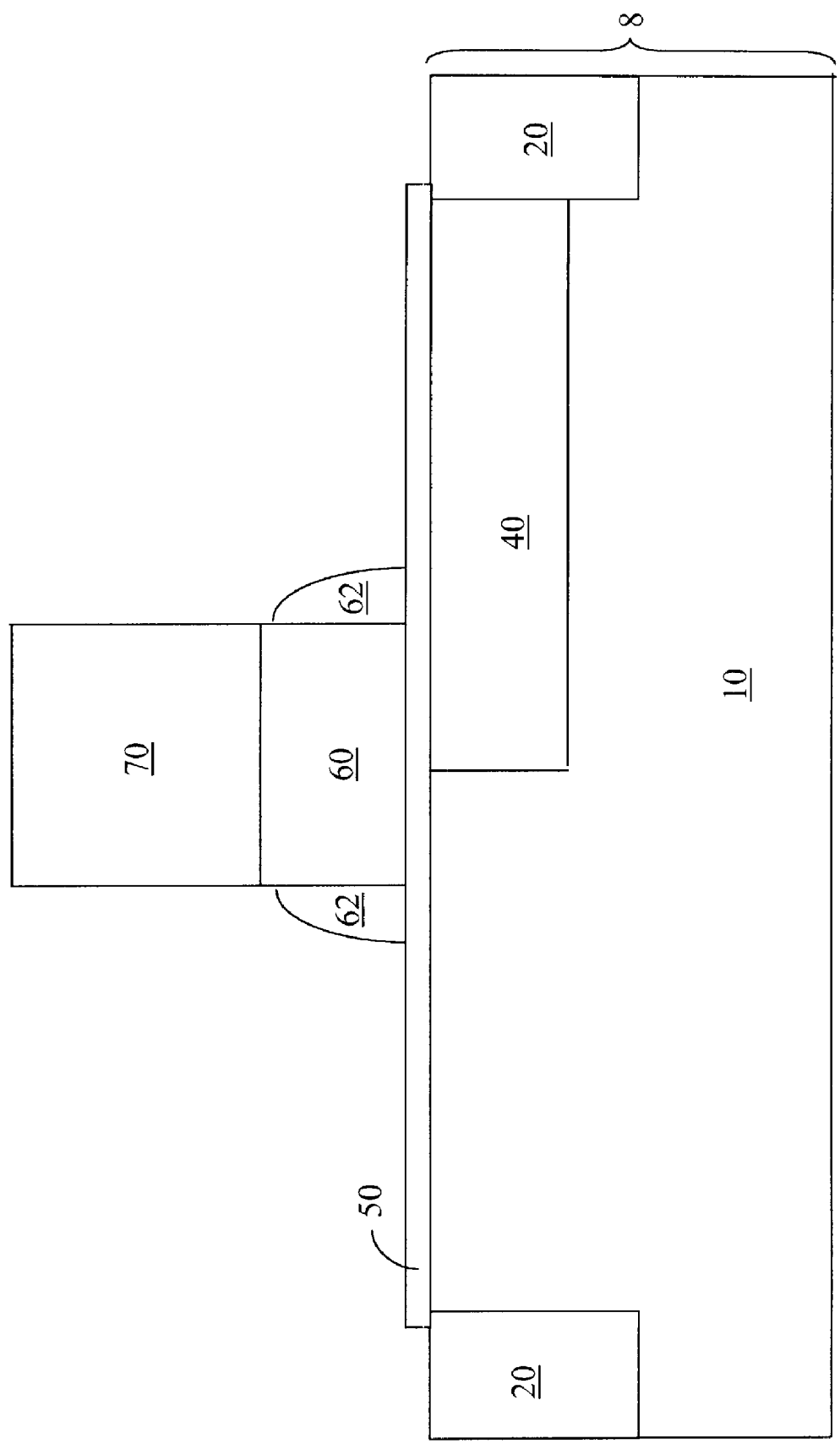

Referring to FIG. 5, a first gate spacer 62 is formed direct on and around the gate electrode 60 by methods well known in the art, i.e., by deposition of a conformal layer followed by an anisotropic ion etch. The lateral thickness of the first gate spacer 62, as measured at the "foot" or the base of the first gate spacer 62, is determined by a target separation distance between the gate electrode 60 and a source region to be subsequently formed. The first gate spacer 62 may comprise a dielectric material such as silicon nitride and/or silicon oxide.

Figure 6:
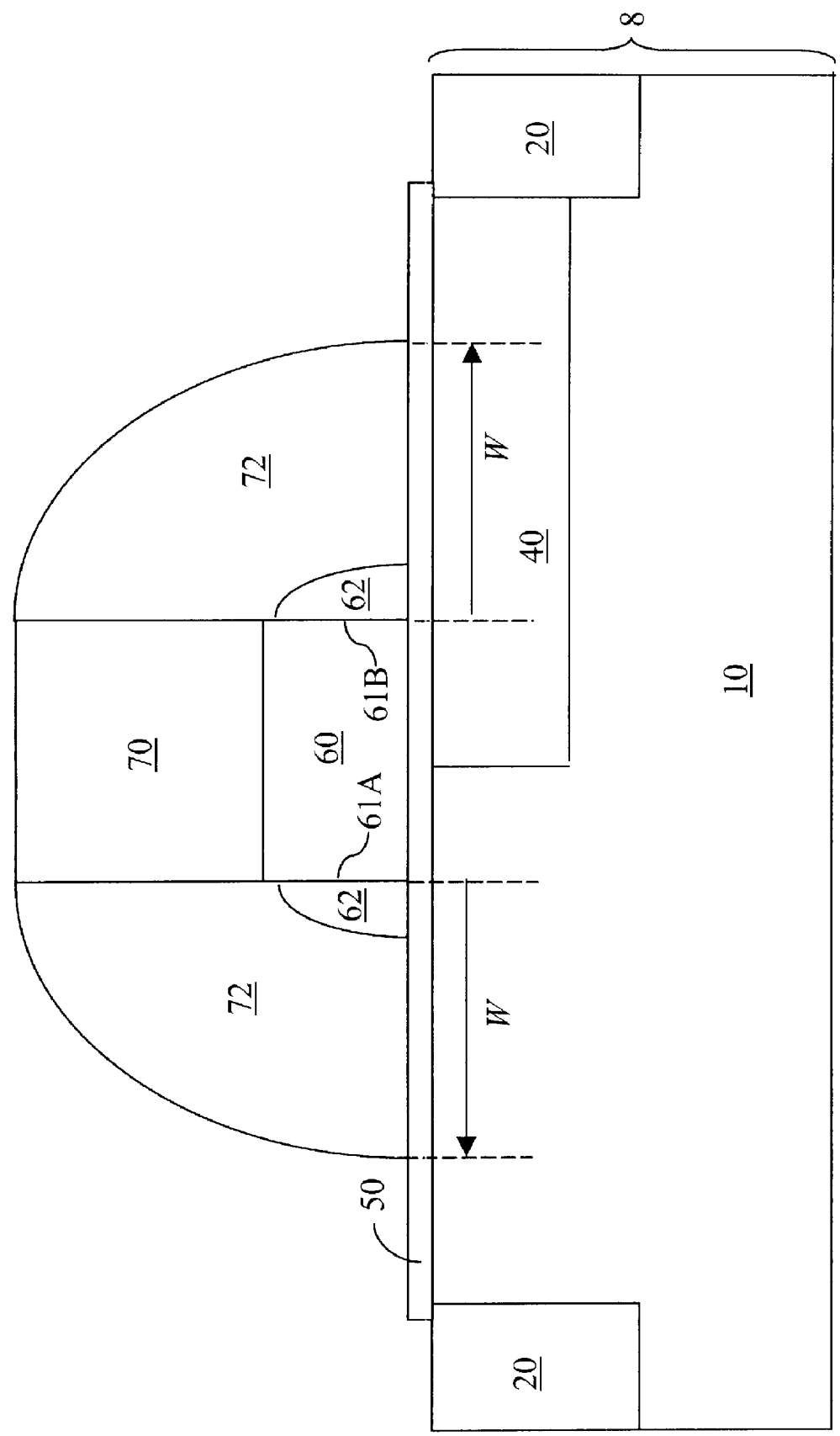

Referring to FIG. 6, a second gate spacer 72 is formed directly on and around the first gate spacer 62. The second gate spacer 72 is of unitary construction, i.e., is formed as a single contiguous piece since the second gate spacer 72 surrounds the stack of the gate electrode 60 and the dielectric cap 70. Thus, the second gate spacer 72 is typically topologically homeomorphic to a torus, or in general, to any three dimensional object of genus 1 which has one topological handle.

The second gate spacer 72 comprises a material that may be removed selective to the shallow trench isolation regions 20 and the dielectric cap 70. Thus, the second gate spacer 72 comprises a different material that the material of the shallow trench isolation regions 20 and the material of the dielectric cap 70. For example, if the dielectric cap 70 comprises borophosphosilicate glass (BPSG), the second gate spacer 72 may comprise a material selected from germanium, a silicon germanium alloy containing germanium at an atomic concentration of 25% or greater, an anti-reflective coating material, and a silicon oxide containing hydrogen at an atomic concentration of 1.0% or greater. As such, the material of the second gate spacer 72 may be removed selective to the material of the dielectric cap 70 and the material of the shallow trench isolation structures 20, and the material of the dielectric cap 70 may be removed selective to the material of the second gate spacer 72 and the material of the shallow trench isolation structures 20.

In case the dielectric cap 70 may comprise an oxide having a high hydrogen content, the second gate spacer 72 may comprise a material selected from germanium, a silicon germanium alloy containing germanium at an atomic concentration of 25% or greater, an anti-reflective coating material, and borophosphosilicate glass (BPSG). In case the dielectric cap 70 comprises germanium or a silicon germanium alloy containing germanium at an atomic concentration of 25% or greater, the second gate spacer 72 may comprise a material selected borophosphosilicate glass (BPSG), an anti-reflective coating material, and a silicon oxide containing hydrogen at an atomic concentration of 1.0% or greater. In case the dielectric cap 70 comprises silicon nitride, the second gate spacer 72 may comprise a material selected from germanium, a silicon germanium alloy containing germanium at an atomic concentration of 25% or greater, an anti-reflective coating material, borophosphosilicate glass (BPSG), and a silicon oxide containing hydrogen at an atomic concentration of 1.0% or greater. The width W of second gate spacer 72, as measured from an edge of the dielectric cap 70 to an outer edge of the second gate spacer 72 that adjoins the gate dielectric 50 or the semiconductor substrate 8 (in case the second gate spacer (72A, 72B) directly adjoins the semiconductor substrate 8), is the same on the source side and on the drain side, and may be from about 100 nm to about 2,000 nm, and typically from about 300 nm to about 1,000 nm in the above cases.

Figure 7:
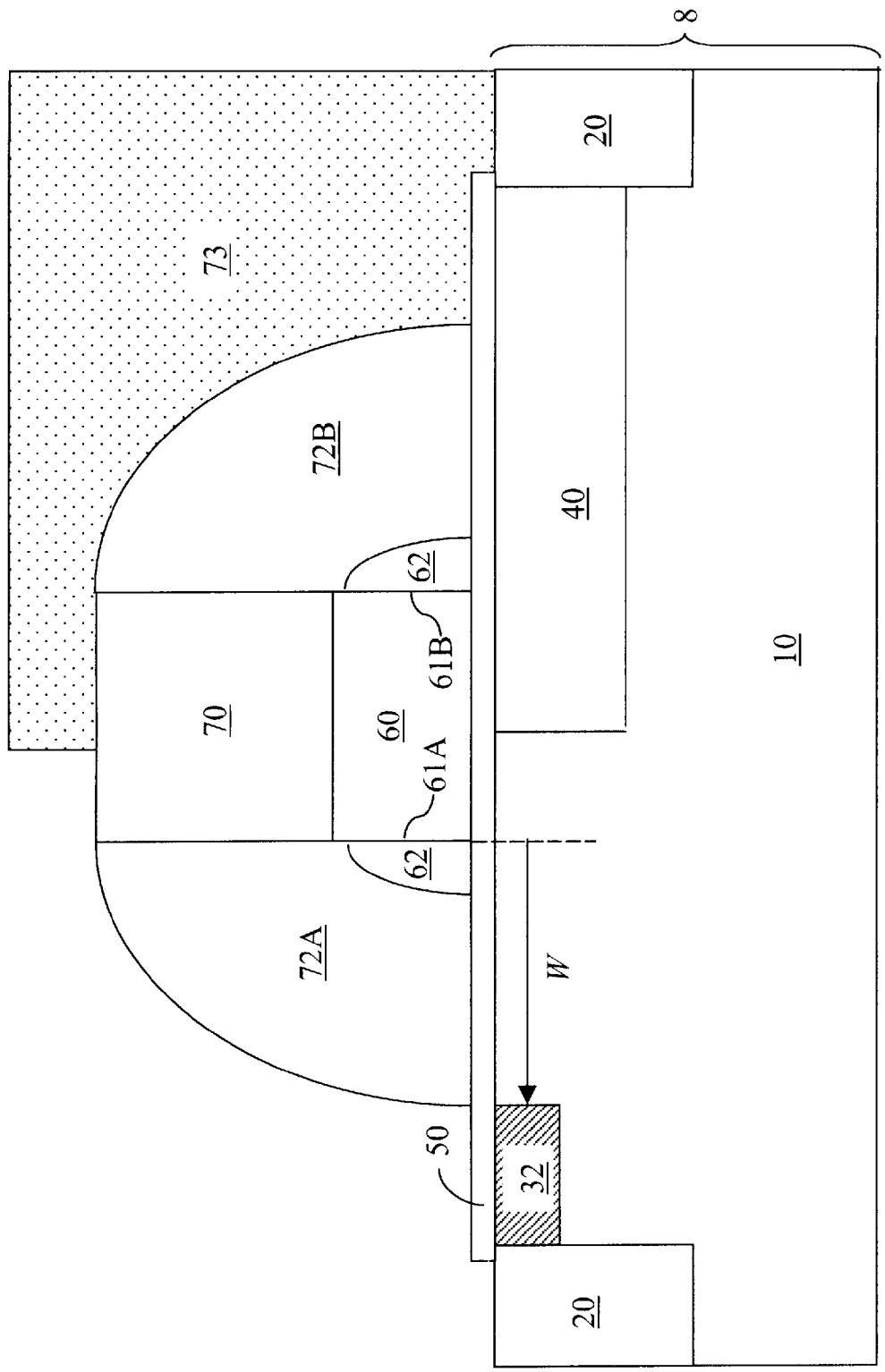

Referring to FIG. 7, a second photoresist 73 is applied over the semiconductor substrate 8, the dielectric cap 70, and the second gate spacer 72, and is lithographically patterned so that an edge of the second photoresist 73 overlies the dielectric cap. The portion of the semiconductor substrate 8 on the drain side is covered, while the portion of the semiconductor substrate 8 on the source side is exposed. An edge of the second photoresist 73 overlies the dielectric cap 70. The exposed portion of the second gate spacer 72 is herein referred to as a second gate spacer source side portion 72A, while the covered portion of the second gate spacer 72 is herein referred to as a second gate spacer drain side portion 72B. The second gate spacer (72A, 72B) comprises the second gate spacer source side portion 72A and the second gate spacer drain side portion 72B, which abut each other. The second gate spacer source side portion 72A laterally adjoins a sidewall of the dielectric cap 70 on the source side, or a "source side sidewall" of the dielectric cap 70, and the second gate spacer drain side portion 72B laterally adjoins another sidewall of the dielectric cap 70 on the drain side, or a "drain side sidewall" of the dielectric cap 70.

Dopants of the first conductivity type are implanted into an area on the source side outside the area covered by the second gate spacer source side portion 72A to form a substrate contact semiconductor region 32 within the substrate semiconductor region 10. An edge of the substrate contact semiconductor region 32 is substantially vertically coincident with an outer sidewall of the second gate spacer source side portion 72A. The lateral distance between the substrate contact semiconductor region 32 and the source side gate electrode sidewall 61A is substantially the same as the width W of the second gate spacer source side portion 72A, which is the same as the width W of the second gate spacer 72 at the step corresponding to FIG. 6 since the lateral width of the second gate spacer 72 is the same irrespective of the sides at which a measurement is taken.

The depth of the substrate contact semiconductor region 32 may be from about 30 nm to about 400 nm, and typically from about 100 nm to about 200 nm, although lesser and greater depths are also contemplated herein. Typically, the substrate contact semiconductor region 32 is heavily doped, i.e., have a dopant concentration from about $3.0 \times 10^{19}/cm^3$ to about $3.0 \times 10^{21}/cm^3$.

Figure 8:
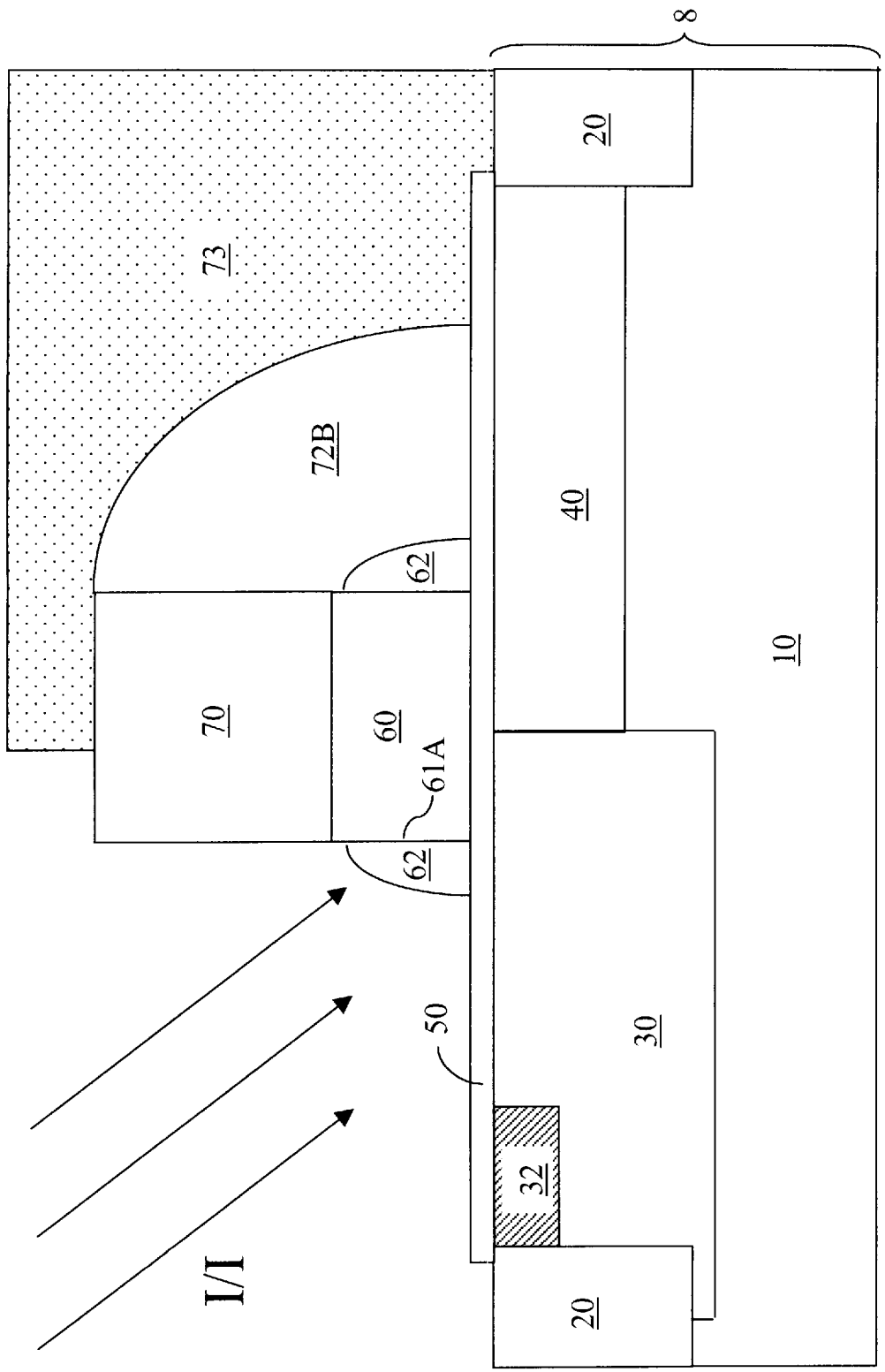

Referring to FIG. 8, the second gate spacer source side portion is removed by an etch, which may be a wet etch or a dry etch, selective to the dielectric cap and the shallow trench isolation regions 20. The source side sidewall of the dielectric cap 70 is exposed as well as a portion of the gate dielectric 50 on the source side or a top surface of the substrate semiconductor region 10 (if the gate dielectric 50 is not present over an exposed portion of the substrate semiconductor region 10).

Angled ion implantation of dopants of the first conductivity type is performed employing the second photoresist 73 and the stack of the gate electrode 60 and the dielectric cap 70 as an implantation mask to form a first conductivity type well 30 on the source side. The first conductivity type well 30 vertically extends from the top surface of the semiconductor substrate 8 to a depth determined by the energy, species, and the angle of the ion implantation. Due to the non-orthogonal angle of the ion implantation, the first conductivity type well 30 extends beneath the gate electrode 60. Thus, the source side gate electrode sidewall 61A is located above the first conductivity type well 30. The first conductivity type well 30 may, or may not, laterally abut the drift region 40.

The first conductivity type well 30 and the drift region 40 comprise the same semiconductor material as the substrate semiconductor region 10. The first conductivity type well 30 has a dopant concentration from about $1.0 \times 10^{16}/cm^3$ to about $3.0 \times 10^{18}/cm^3$, and typically from about $3.0 \times 10^{16}/cm^3$ to about $1.0 \times 10^{18}/cm^3$, although lesser and greater dopant concentrations are also contemplated herein. Preferably, the dopant concentration of the first conductivity type well 30 is greater than the dopant concentration of the substrate semiconductor region 10. The depth of the first conductivity type well 30 may be greater than, or may be substantially the same as, the depth of the drift region 40. The depth of the first conductivity type well 30 may be from about 100 nm to about 1,000 nm, and typically from about 150 nm to about 600 nm. The second photoresist 73 is subsequently removed.

Figure 9:
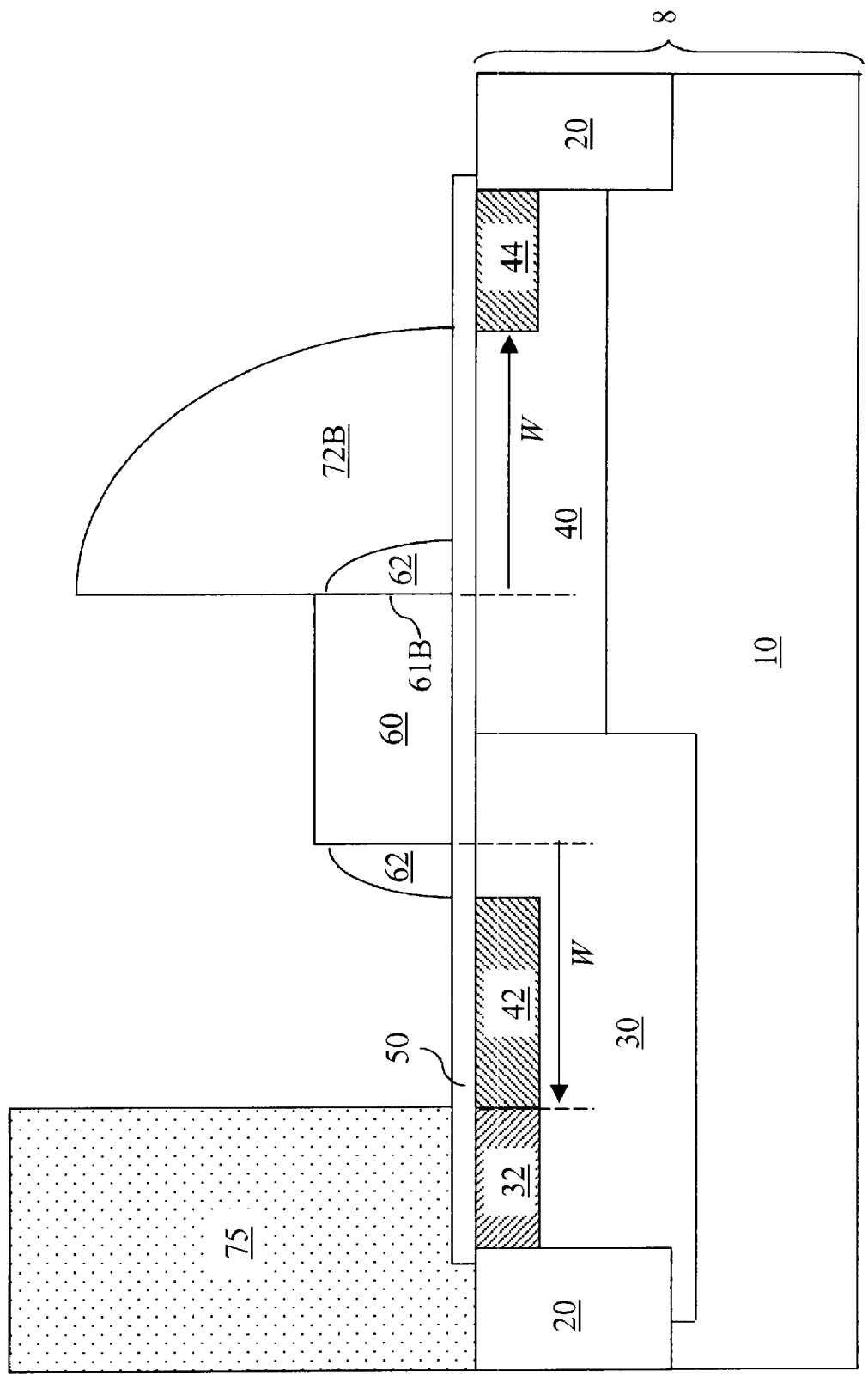

Referring to FIG. 9, the dielectric cap 70 is removed selective to the second gate spacer drain side portion 72B and the shallow trench isolation structures 20. This processing step employs a wet etch or a dry etch that provides removal of the material of the dielectric cap 70 selective to the material of the second gate spacer drain side portion 72B and the material of the shallow trench isolation structures 20.

A third photoresist 75 is applied over the semiconductor substrate 8, the gate electrode 60, and the second gate spacer drain side portion 72B, and lithographically patterned to expose a first area on the source side and a second area on the drain side that are not covered by the third photoresist 75, the gate electrode 60, the first gate spacer 62, or the second gate spacer drain side portion 72B. The first area overlies the first conductivity type well 30 and the second area overlies the drift region 40. Dopants of the second conductivity type are implanted into the first area to form a source region 42 within the first conductivity type well 30. During the same ion implantation process, dopants of the second conductivity type are also implanted into the second area to form a drain region 44 within the drift region 40. The depth of the source region 42 and the drain region 44 may be from about 30 nm to about 400 nm, and typically from about 100 nm to about 200 nm, although lesser and greater depths are also contemplated herein. Typically, the source region 42 and the drain region 44 are heavily doped, i.e., have a dopant concentration from about $3.0 \times 10^{19}/cm^3$ to about $3.0 \times 10^{21}/cm^3$. The third photoresist 75 is subsequently removed. The source region 42 may, or may not, laterally abut the substrate contact semiconductor region 32.

The lateral distance between the drain region 44 and the drain side gate electrode sidewall 61B is substantially the same as the width W of the second gate spacer drain side portion 72B, which is the same as the width W of the second gate spacer 72 at the step corresponding to FIG. 6 since the lateral width of the second gate spacer 72 is the same irrespective of the sides at which a measurement is taken. Thus, the substrate contact semiconductor region 32 and the drain region 44 are laterally spaced from the gate electrode 60 by the substantially same distance, i.e., the width of the width W of the second gate spacer 72 at the step corresponding to FIG. 6.

Figure 10:
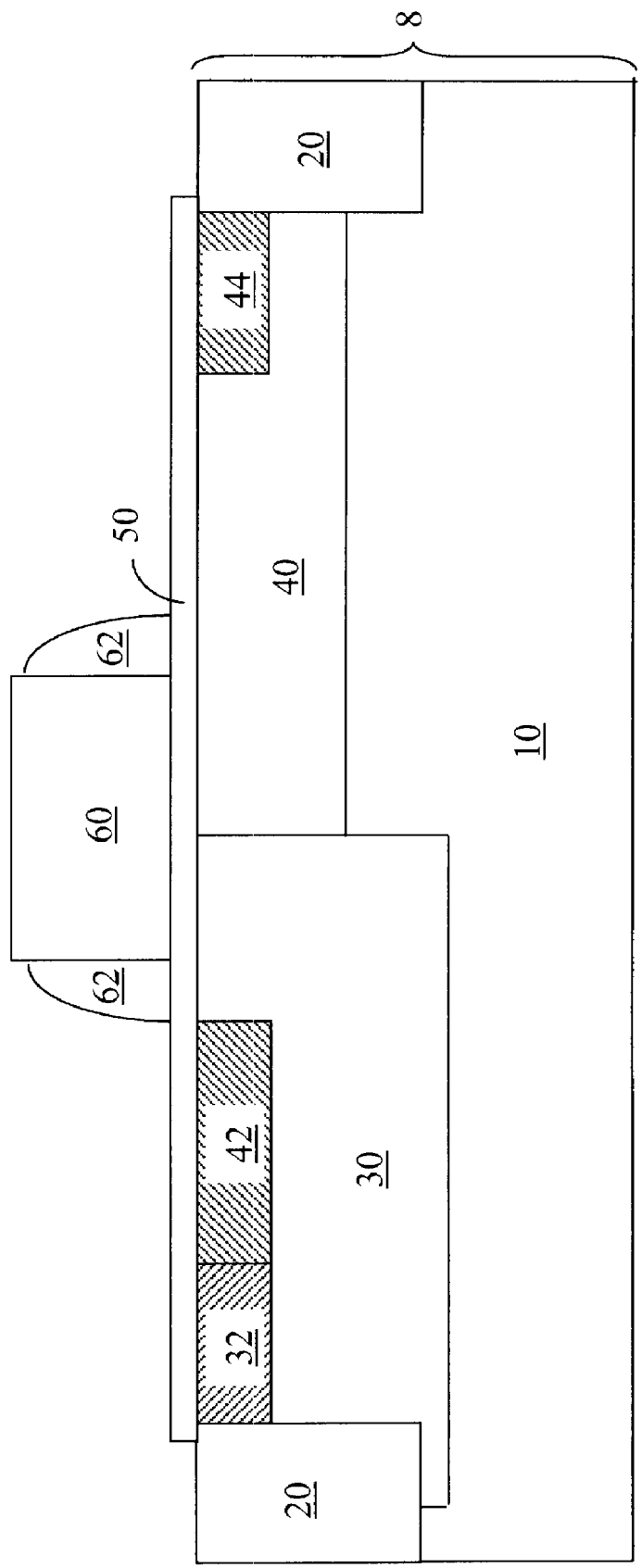

Referring to FIG. 10, the second gate spacer drain side portion 72B is removed selective to the gate electrode 60 and the shallow trench isolation structures 20. Preferably, the removal of the second gate spacer drain side portion 72B is selective to the gate dielectric 50 or the material of the semiconductor substrate 8, i.e., the material of the substrate contact semiconductor region 32, the source region 32, the drift region 40, and the drain region 44.

Figure 11:
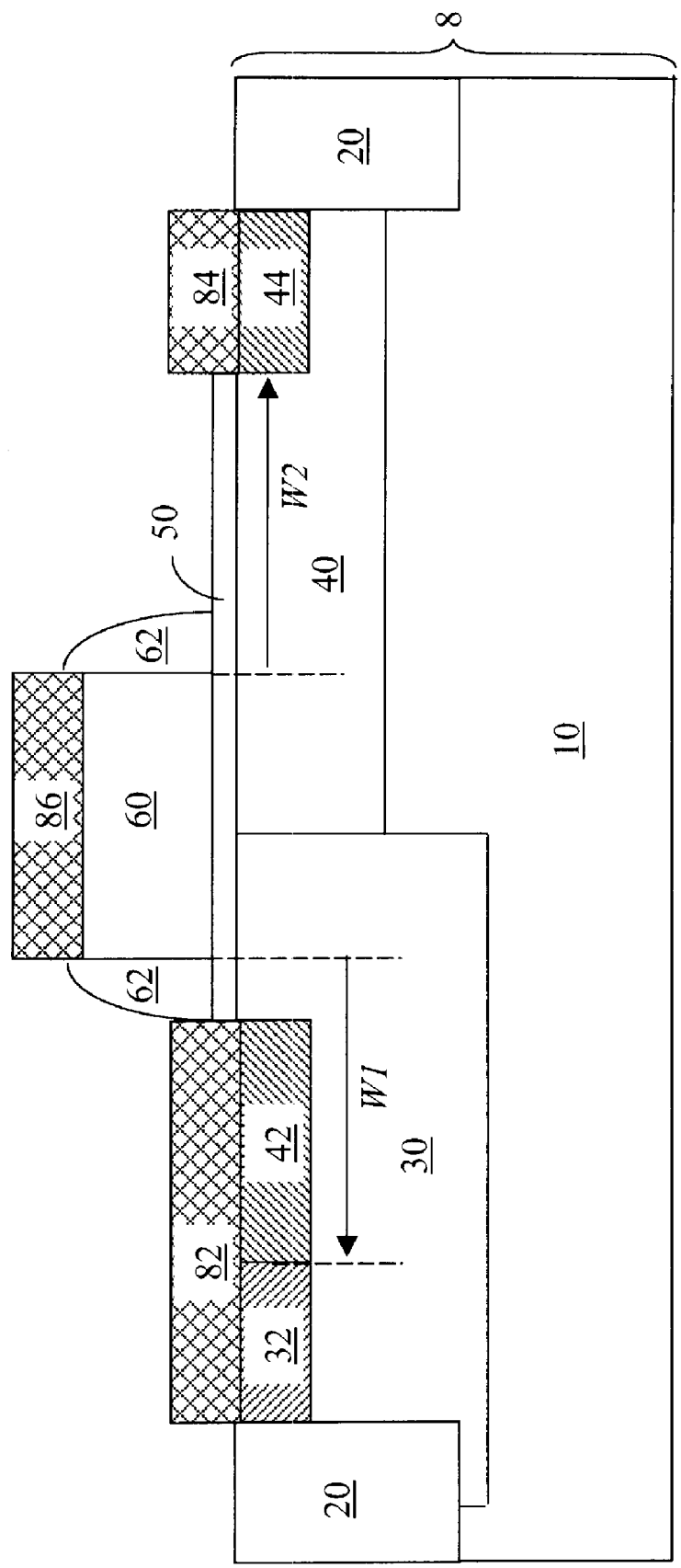

Referring to FIG. 11, various metal semiconductor alloys are formed on exposed semiconductor surfaces. Specifically, a source and substrate metal contact 82 and a drain metal contact 84, which comprise a metal semiconductor alloy derived from the semiconductor material of the semiconductor substrate 8, are formed over the first conductivity type well 30 and over the drift region 40, respectively. A gate metal contact 86, which comprises a metal semiconductor alloy derived from the material comprising the gate electrode 60, is formed on the gate electrode 60. In case the semiconductor substrate 8 or the gate electrode 60 comprises silicon, the corresponding metal silicide alloy is a metal silicide.

The first exemplary semiconductor structure is a lateral diffusion metal oxide semiconductor field effect transistor (LDMOSFET) which comprises:

a first conductivity type well 30 having a doping of a first conductivity type and located in a semiconductor substrate 8;

a drift region 40 having a doping of a second conductivity type which is the opposite of the first conductivity type, and located in the semiconductor substrate 8;

a drain region 44 having a doping of the second conductivity type, laterally abutting the drift region 40, and located in the semiconductor substrate 8;

a substrate contact semiconductor region 32 having a doping of the first conductivity type and located in the semiconductor substrate 8;

a source region 42 having a doping of the second conductivity type and located in the first conductivity type well 30, wherein the substrate contact semiconductor region 32 laterally abuts the source region 42;

a gate dielectric 50 vertically abutting the first conductivity type well 30 and the drift region 40; and a gate electrode 60 vertically abutting the gate dielectric 50 and straddling over the first conductivity type well 30 and the drift region 40, wherein a first lateral distance W1 between the substrate contact semiconductor region 32 and the gate electrode 60 is the same as a second lateral distance W2 between the drain region 44 and the gate electrode 60.

As the manufacturing process illustrates, the first lateral distance W1 and the second lateral distance W2 are substantially the same as the width W of the second gate spacer 72 at the processing step corresponding to FIG. 6. Thus, the lateral distance, or the offset, between the gate electrode 60 and the drain region 44 is not determined by a lithographic process, but is determined by the lateral width W of the second gate spacer 72 at the processing step corresponding to FIG. 6. A tighter distribution of the lateral distance between the gate electrode 60 and the drain region 44 provides a tighter control on the resistance of the drift region 40, which is advantageously employed to provide a higher performance or a lower power consumption of the inventive lateral diffusion metal oxide semiconductor field effect transistor (LDMOSFET) compared to prior art devices providing a similar functionality.

Figure 12:
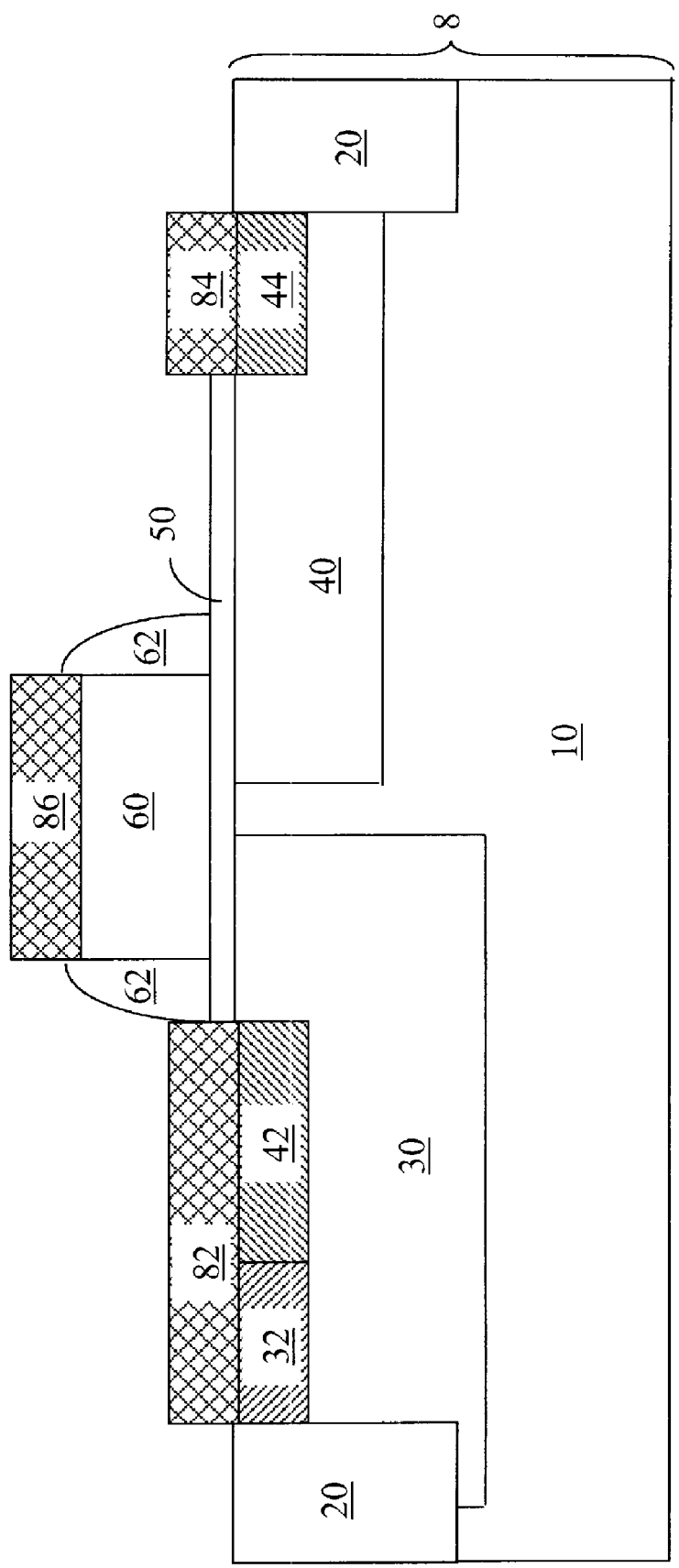
FIG. 12 is a vertical cross-sectional views of a variation of the first exemplary semiconductor structure.

Referring to FIG. 12, a variation of the first exemplary semiconductor structure is provided, in which a first conductivity type well 30 and a drift region 40 are separated from each other by a portion of the substrate semiconductor region 10. The same processing steps may be employed as on the first exemplary semiconductor structure except for modification of angled implantation steps employed to form the first conductivity type well 30 and the drift region 40 such that lateral extension of the first conductivity type well 30 and/or the drift region 40 is altered to induce the separation of the first conductivity type well 30 and the drift region 40.

Figure 13:
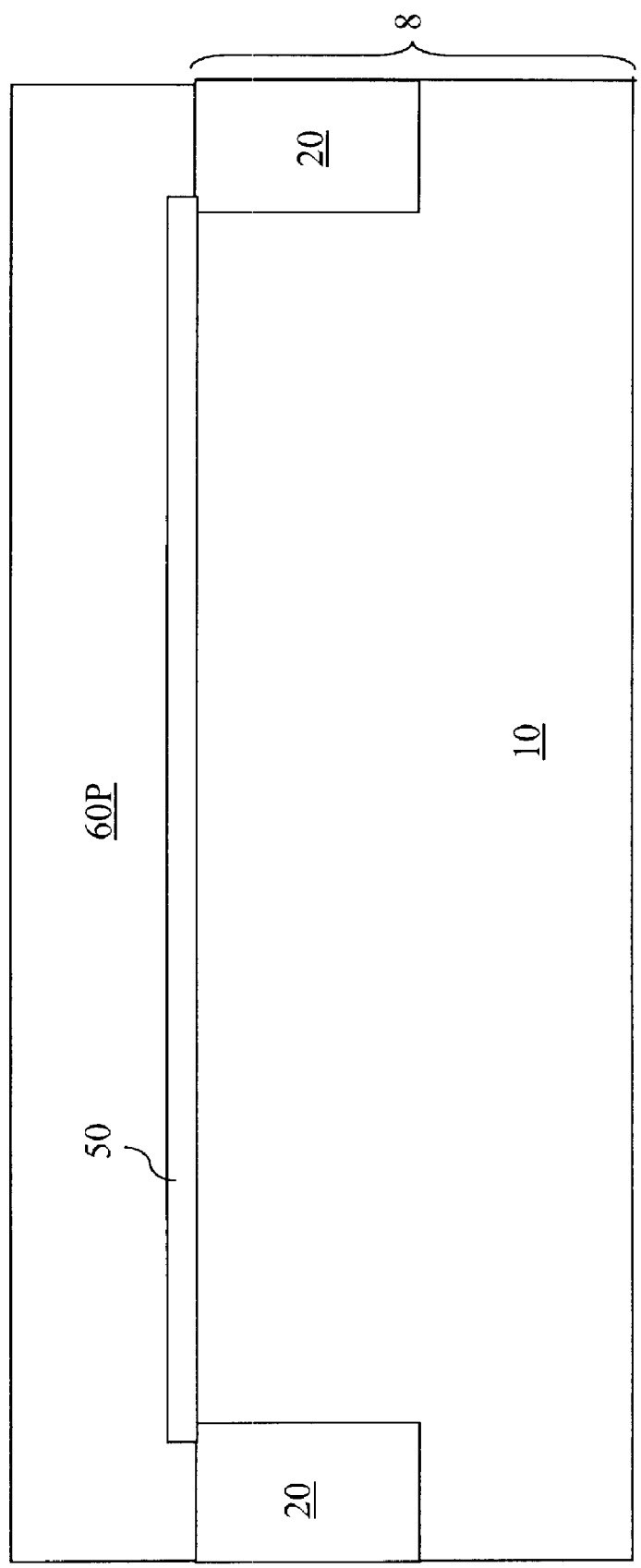
FIGS. 13-22 are sequential vertical cross-sectional views of a second exemplary semiconductor structure according to a second embodiment of the present invention.

Referring to FIG. 13, a second exemplary structure according to a second embodiment of the present invention comprises a semiconductor substrate 8 containing a substrate semiconductor region 10 and shallow trench isolation regions 20. The structural and compositional properties of the substrate semiconductor region 10 and the shallow trench isolation regions 20 are the same as in the first embodiment.

A gate dielectric 50 is formed on exposed surfaces of the semiconductor region 10. The structural and compositional properties of the gate dielectric 50 are the same as in the first embodiment. A gate electrode material layer 60P is formed on the gate dielectric 50 and/or the shallow trench isolation structures 20. The composition and thickness of the gate electrode material layer 60P are substantially the same as the composition and thickness of the gate electrode 60 in the first embodiment.

Figure 14:
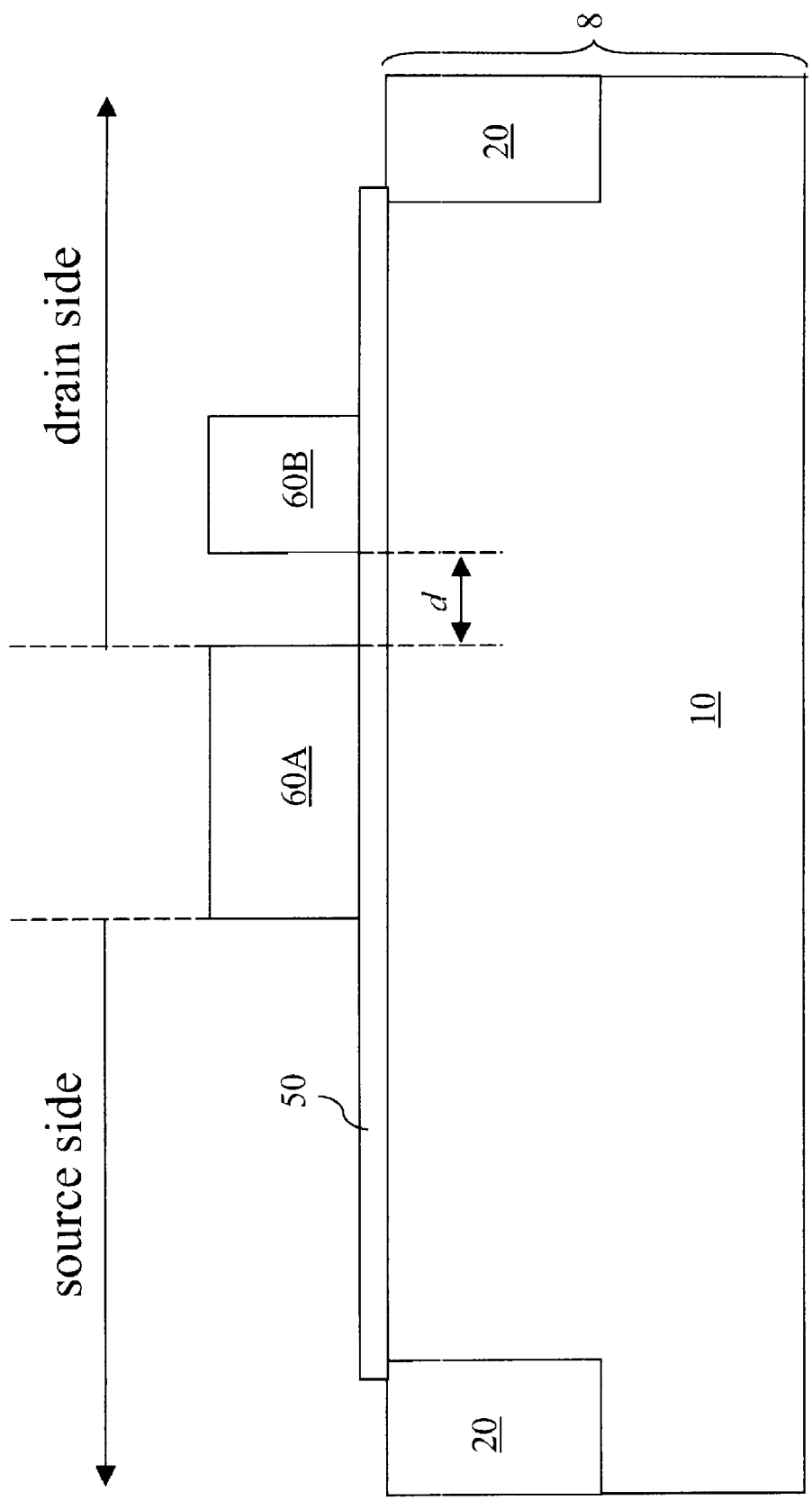

Referring to FIG. 14, a gate electrode 60A and a disposable conductive portion 60B are formed by lithographic patterning of the gate electrode material layer 60P employing a photoresist (not shown) and an anisotropic etch such as a reactive ion etch. The gate electrode 60A and the disposable conductive portion 60B comprise the same material since both are remaining portions of the gate electrode material layer 60P after the lithographic patterning. The gate electrode 60A and the disposable conductive portion 60B are disjoined from each other, and are separated by a separation distance sd. The separation distance sd is less than twice of a lateral width of a dielectric gate spacer to be subsequently formed.

The side of the area that is not covered by the stack of the gate electrode 60 and containing the disposable conductive portion 60B is herein referred to as a "drain side," while the opposite side of the area that is not covered by the stack of the gate electrode 60 and not containing the disposable conductive portion 60B is herein referred to as a "source side." A source region is subsequently formed on the source side, and a drain region is subsequently formed on the drain side, as will be described below.

Figure 15:
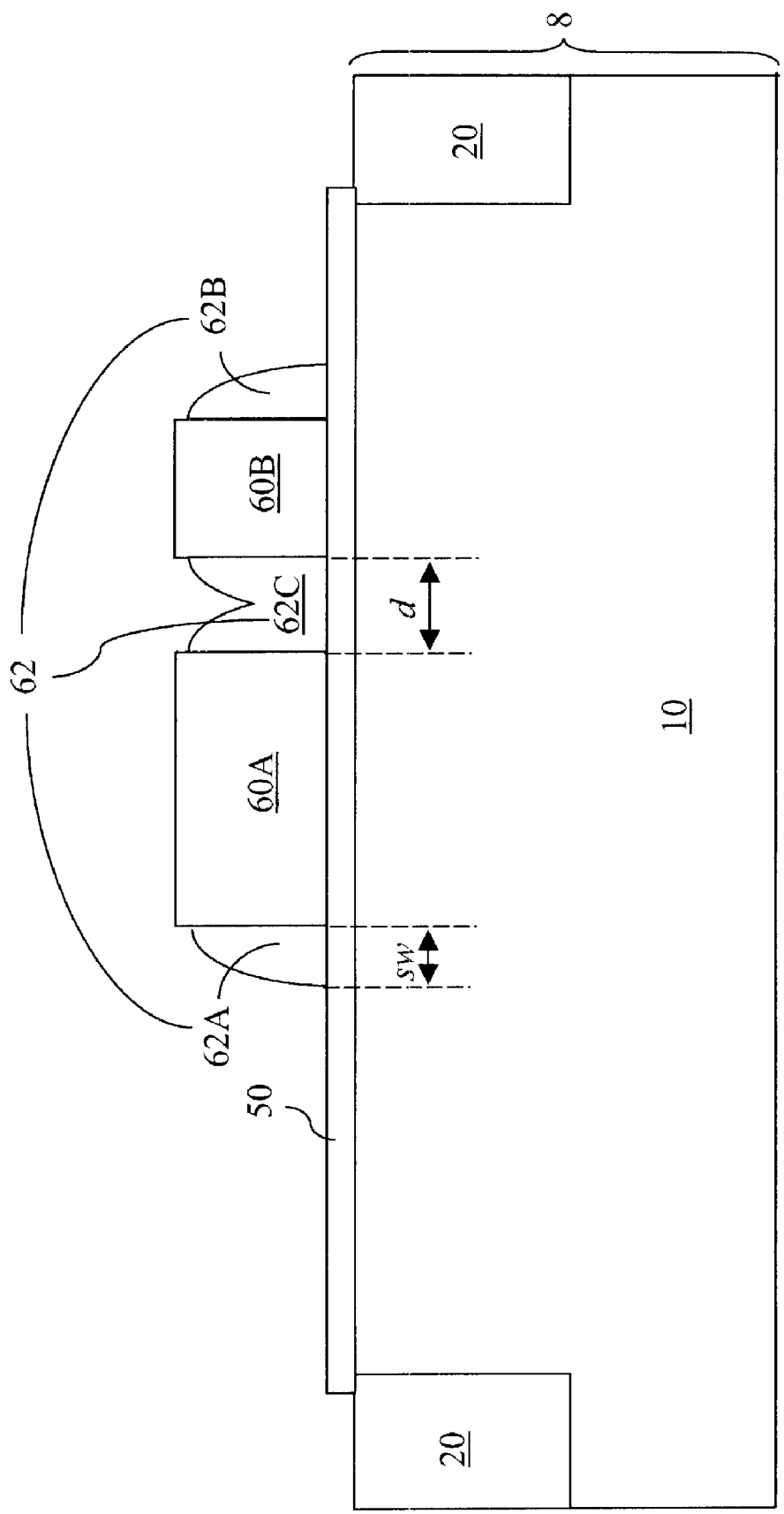
Figure 15A:
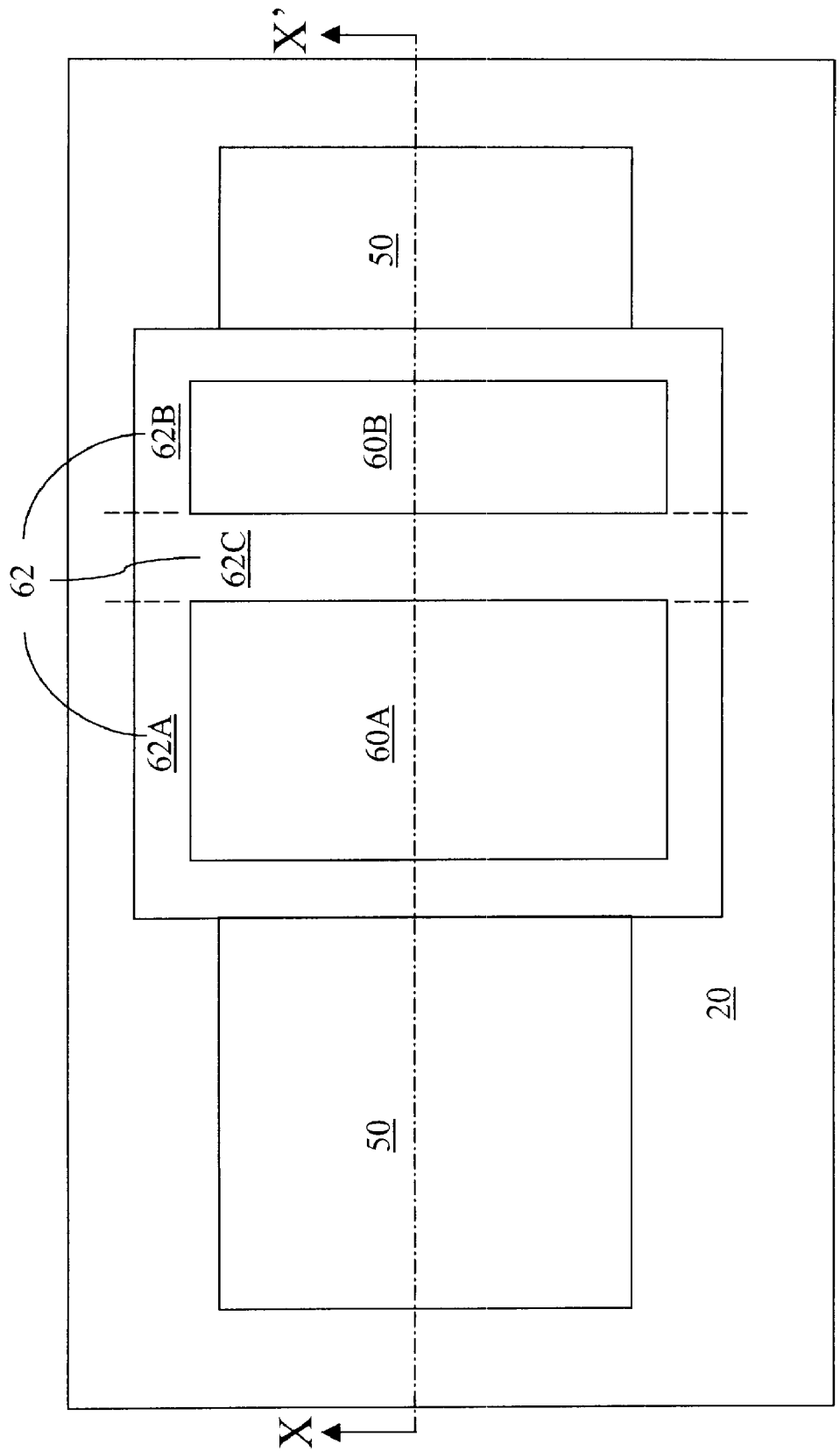
FIGS. 15A and 21A are top-down views of the second exemplary semiconductor structure at a step corresponding to FIGS. 15 and 21, respectively. The plane X-X' in FIGS. 15A and 21A is the plane of the vertical cross-sectional view of FIGS. 15 and 21, respectively.

Referring to FIGS. 15 and 15A, a dielectric gate spacer 62 is formed directly on and around the gate electrode 60A and the disposable conductive portion 60B by conformal deposition of a dielectric material layer (not shown) followed by an anisotropic etch such as a reactive ion etch. The dielectric gate spacer 62 comprises a dielectric material such as silicon oxide or silicon nitride. The thickness of the dielectric material layer is greater than one half of the separation distance sd so that the space between the gate electrode 60A and the disposable conductive portion 60B is plugged by the dielectric gate spacer 62.

The dielectric gate spacer 62 is of unitary construction and contains two holes such that a first hole coincides with the gate electrode 60A and a second hole coincides with the disposable conductive portion 60B. Topologically, the dielectric gate spacer 62 is homeomorphic to a three-dimensional object of genus 2, i.e., has two topological "handles." The dielectric gate spacer 62 comprises a dielectric gate spacer first portion 62A, a dielectric gate spacer second portion 62B, and a dielectric gate spacer third portion 62C. The dielectric gate spacer first portion 62A laterally abuts the gate electrode 60A and does not abut the disposable conductive portion 62B; the dielectric gate spacer second portion 62B laterally abuts the disposable conductive portion 60B and does not abut the gate electrode 60A; and the dielectric gate spacer third portion 62C laterally abuts the gate electrode 60A and the disposable conductive portion 60B. In other words, the dielectric gate spacer third portion 62C is the portion of the dielectric gate spacer 62 that fills the space between the gate electrode 60A and the disposable conductive portion 60B. The separation distance sd is the lateral distance between the electrode and the disposable conductive portion. As such, the separation distance sd is less than twice a lateral width of the dielectric gate spacer first portion 62A as measured at a bottom of the dielectric gate spacer first portion 62A. Since the lateral width of the dielectric gate spacer second portion 62B is the same as the lateral width of the dielectric gate spacer first portion 62A, the separation distance sd is less than twice the lateral width of the dielectric gate spacer second portion 62B as measured at a bottom of the dielectric gate spacer second portion 62B.

Figure 16:
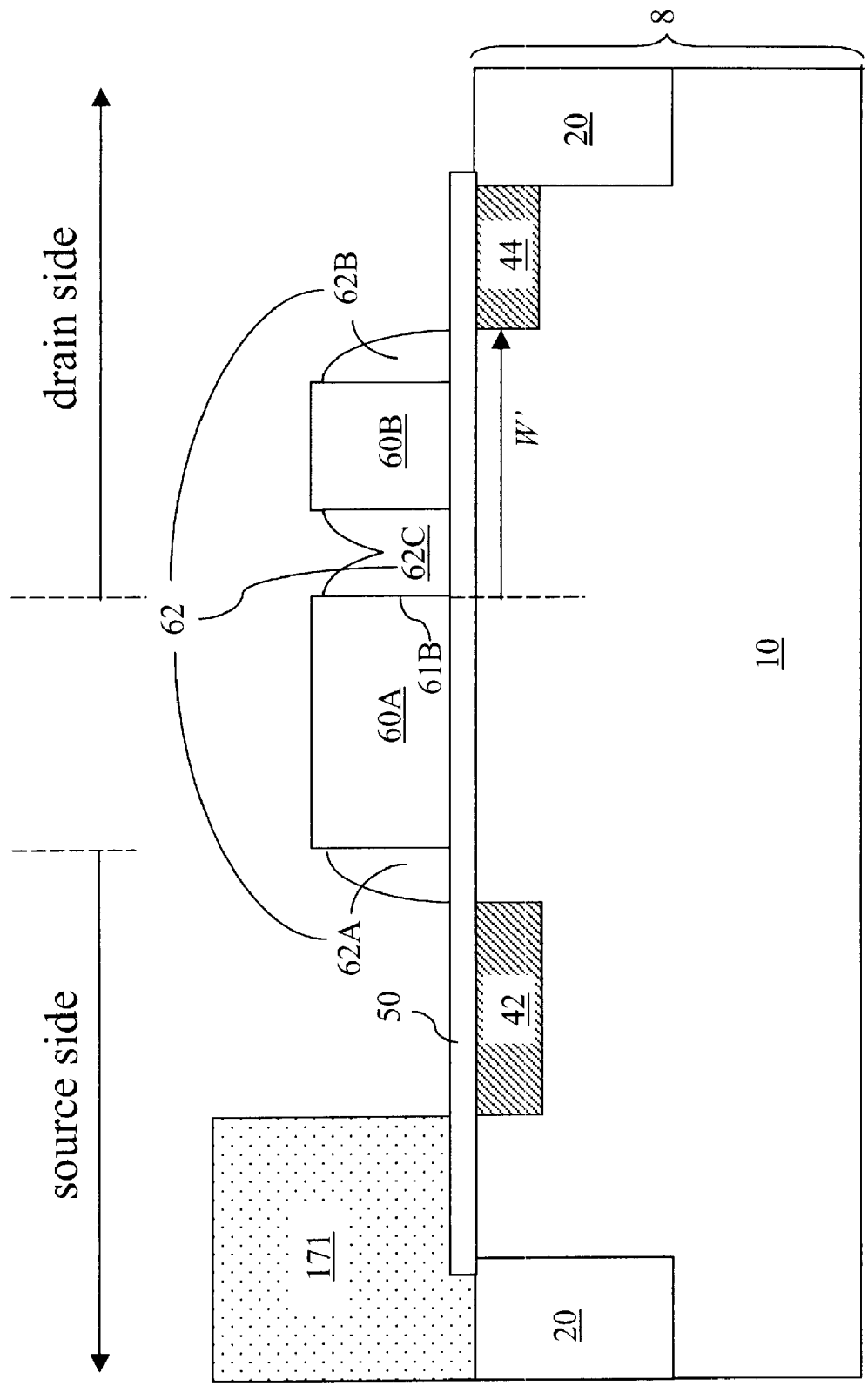

Referring to FIG. 16, a first photoresist 171 is applied over the semiconductor substrate 8, the gate electrode 60A, the disposable conductive portion 60B, and the dielectric gate spacer 62, and lithographically patterned to expose a first area on the source side and a second area on the drain side that are not covered by the first photoresist 171, the gate electrode 60A, the disposable conductive portion 60B, the dielectric gate spacer 62. Dopants of the second conductivity type are implanted into the first area to form a source region 42 within the substrate semiconductor region 10. During the same ion implantation process, dopants of the second conductivity type are also implanted into the second area to form a drain region 44 within the substrate semiconductor region 10. The depth of the source region 42 and the drain region 44 may be from about 30 nm to about 400 nm, and typically from about 100 nm to about 200 nm, although lesser and greater depths are also contemplated herein. Typically, the source region 42 and the drain region 44 are heavily doped, i.e., have a dopant concentration from about $3.0\times10^{19}/cm^3$ to about $3.0\times10^{21}/cm^3$. The first photoresist 71 is subsequently removed.

An edge of the source region 42 is substantially vertically coincident with an outer sidewall of the dielectric gate spacer first portion 62A. Likewise, an edge of the drain region 44 is substantially vertically coincident with an outer sidewall of the dielectric gate spacer second portion 62B. The lateral distance W' between the drain region 44 and a drain side gate electrode sidewall 61B, which is the sidewall of the gate electrode 60 on the drain side, is determined by the sum of the separation distance sd between the gate electrode 60A and the disposable conductive portion 60B, a width of the disposable conductive portion 60B, and a lateral width of the dielectric gate spacer second portion 62B as measured at a bottom of the dielectric gate spacer second portion 62B, which is the same as the lateral width of the dielectric gate spacer first portion 62A. Thus, the lateral distance W' between the drain region 44 and a drain side gate electrode sidewall 61B is not affected by any overlay variations in lithographic processes, but is tightly controlled and is subject to a variation only through the lateral width of the dielectric gate spacer second portion 62B, which is typically much less than lithographic overlay variations.

Figure 17:
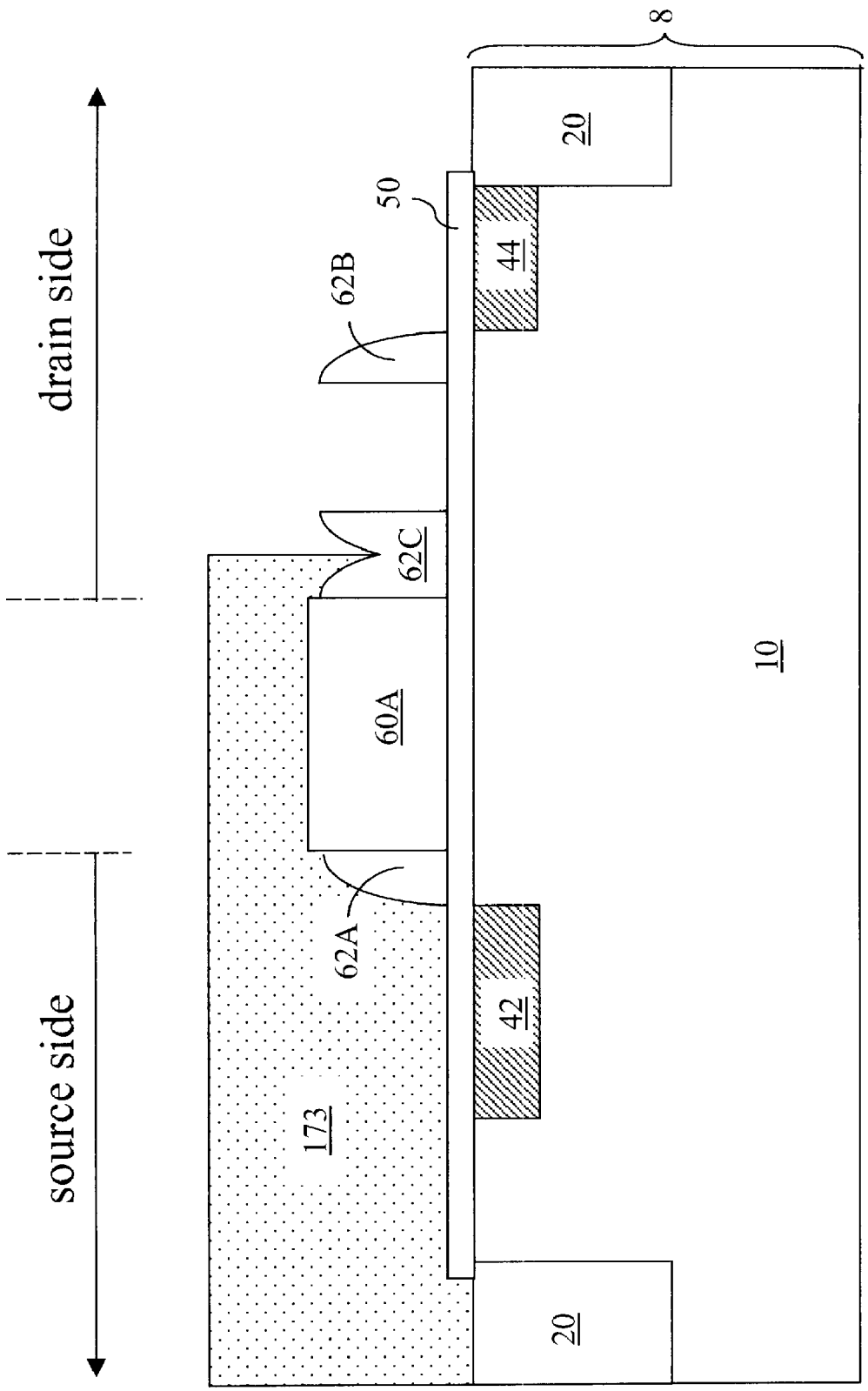

Referring to FIG. 17, a second photoresist 173 is applied over the semiconductor substrate 8, the gate electrode 60A, the disposable conductive portion 60B, and the dielectric gate spacer 62, and lithographically patterned to expose the disposable conductive portion 60B, while covering the gate electrode 60A and the source side. The dielectric gate spacer first portion 62A is covered by the second photoresist 173, the dielectric gate spacer second portion 62B is exposed, and the dielectric gate spacer third portion 62C is partially covered and partially exposed. In other words, an edge of the second photoresist 173 is located directly on the dielectric gate spacer third portion 62C after the lithographic patterning.

The disposable conductive portion 60B is removed by an etch, which may be a wet etch or a dry etch, selective to the shallow trench isolation structures 20 and at least one of the gate dielectric 50 and the material of the substrate semiconductor region 10. For example, in case the disposable conductive portion 60B comprises polysilicon or a silicon germanium alloy, a reactive ion etch that is selective to the gate dielectric 50 mat be employed.

Figure 18:
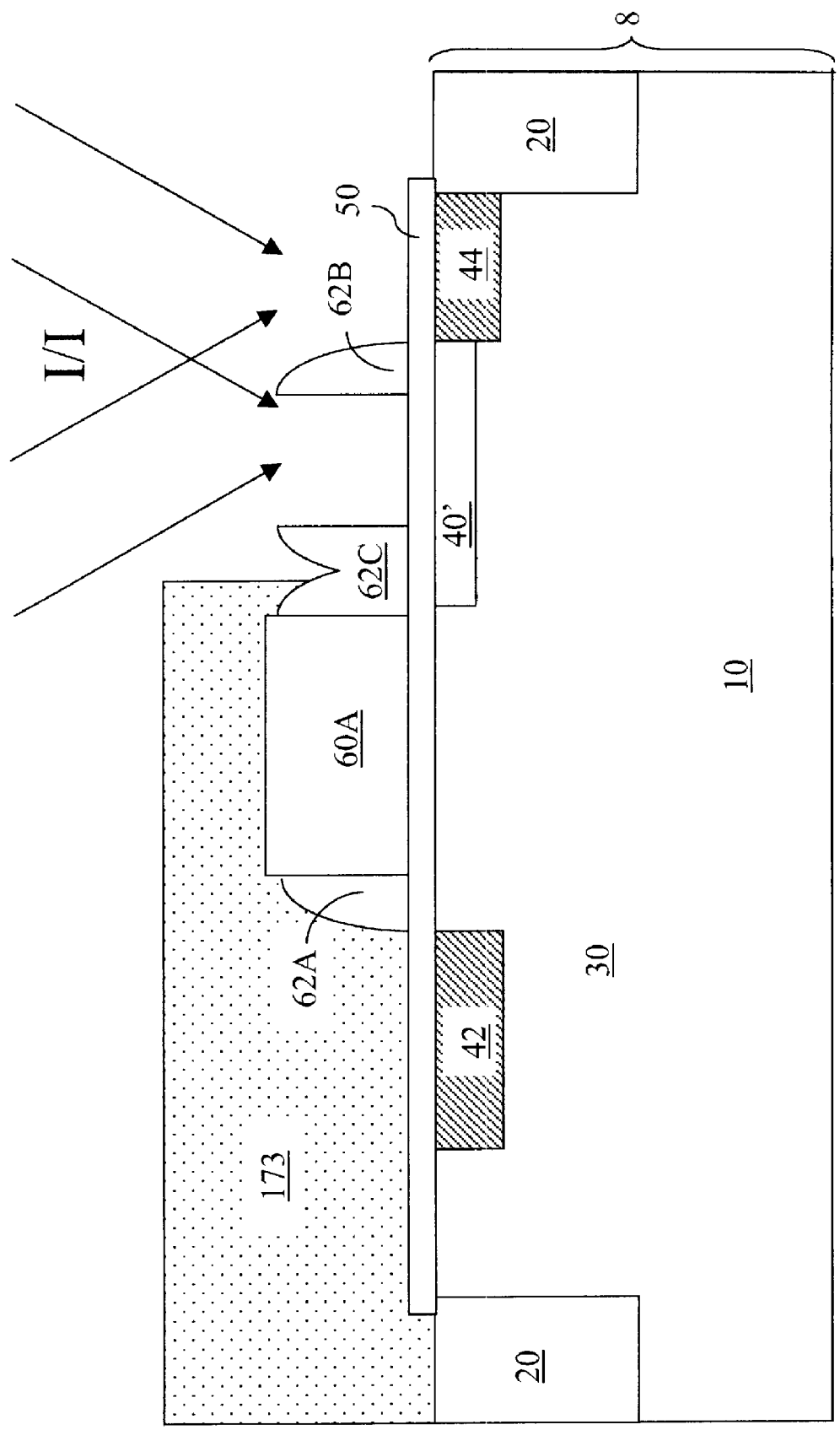

Referring to FIG. 18, angled ion implantation of dopants of the second conductivity type is performed employing the second photoresist 173 as an implantation mask to form a drift region 40' on the drain side. The angled ion implantation may have one tilt angle or multiple tilt angles. In case the angles ion implantation has multiple tilt angles, the effect of shading by the dielectric gate spacer second portion 62B and the dielectric gate spacer third portion 62C may be alleviated. The drift region 40' vertically extends from the top surface of the semiconductor substrate 8 to a depth determined by the energy, species, and the angle of the ion implantation. The drift region 40' has a dopant concentration from about $1.0\times10^{16}/cm^3$ to about $3.0\times10^{18}/cm^3$, and typically from about $3.0\times10^{16}/cm^3$ to about $1.0\times10^{18}/cm^3$, although lesser and greater dopant concentrations are also contemplated herein. Typical depths of the drift region 40' may be from about 25 nm to about 1,000 nm, and typically from about 50 nm to about 200 nm. The drift region laterally abuts the drain region 44. The second photoresist 173 is subsequently removed.

Figure 19:
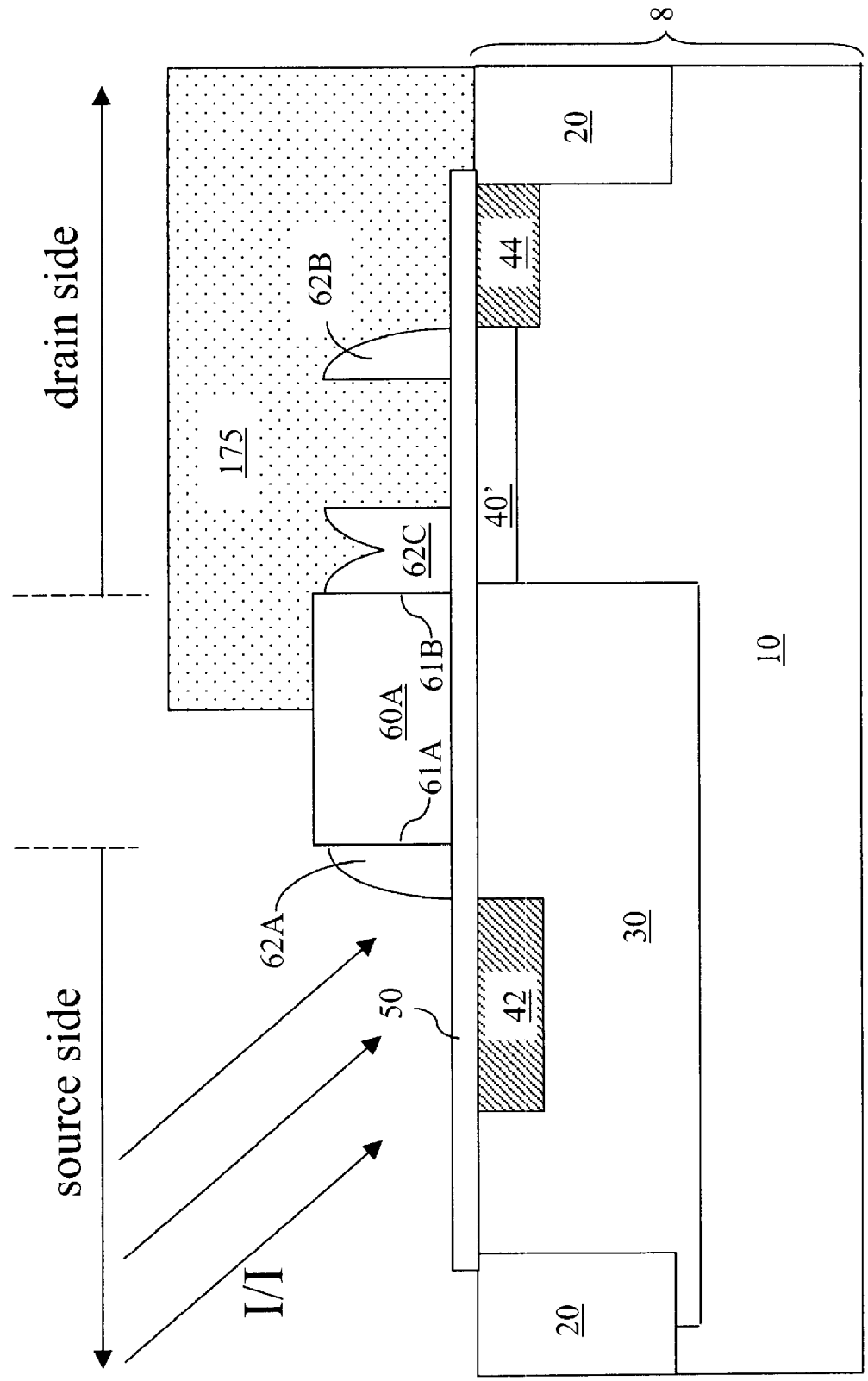

Referring to FIG. 19, a third photoresist 175 is applied over the semiconductor substrate 8, the gate electrode 60A, and the dielectric gate spacer 62, and lithographically patterned to expose the source side and a portion of the gate electrode 60A. In other words, an edge of the third photoresist 175 is located directly on the gate electrode 60A after the lithographic patterning.

Angled ion implantation of dopants of the first conductivity type is performed employing the third photoresist 175 as an implantation mask to form a first conductivity type well 30 on the source side and directly underneath the gate electrode 60A. Due to the non-orthogonal angle of the ion implantation, the first conductivity type well 30 extends beneath the gate electrode 60. The lateral extent of the first conductivity type well 30 may, or may not, extend past the drain side gate electrode sidewall 61B. Also, the first conductivity type well 30 may, or may not, laterally abut the drift region 40' depending on the device performance requirement. The first conductivity type well 30 vertically extends from the top surface of the semiconductor substrate 8 to a depth determined by the energy, species, and the angle of the ion implantation. Thus, the source side gate electrode sidewall 61A is located above the first conductivity type well 30.

The first conductivity type well 30 and the drift region 40' comprise the same semiconductor material as the substrate semiconductor region 10. The first conductivity type well 30 has a dopant concentration from about $1.0\times10^{16}/cm^3$ to about $3.0\times10^{18}/cm^3$, and typically from about $3.0\times10^{16}/cm^3$ to about $1.0\times10^{18}/cm^3$, although lesser and greater dopant concentrations are also contemplated herein. Preferably, the dopant concentration of the first conductivity type well 30 is greater than the dopant concentration of the substrate semiconductor region 10. The depth of the first conductivity type well 30 may be greater than, or may be substantially the same as, the depth of the drift region 40. The depth of the first conductivity type well 30 may be from about 100 nm to about 1,000 nm, and typically from about 150 nm to about 600 nm. The third photoresist 175 is subsequently removed.

Figure 20:
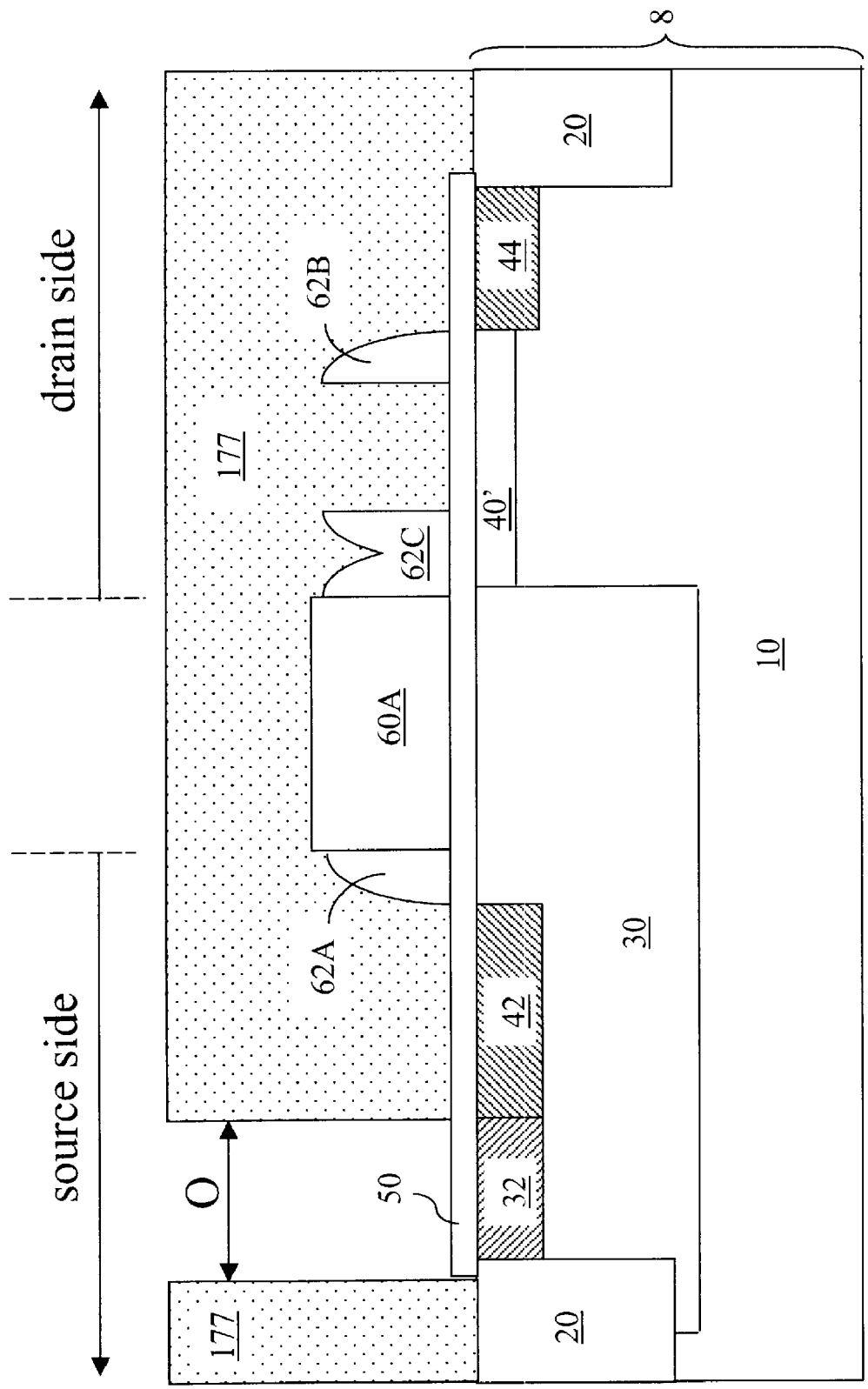

Referring to FIG. 20, a fourth photoresist 177 is applied over the semiconductor substrate 8, the gate electrode, and the dielectric gate spacer (62A, 62B, 62C), and is lithographically patterned so that an opening O is formed in the source side adjacent to the source region 42. Dopants of the first conductivity type are implanted through the opening O to form a substrate contact semiconductor region 32 within the first conductivity type well 30. The substrate contact semiconductor region 32 may, or may not, laterally abut the source region 42. The fourth photoresist 177 is subsequently removed.

The depth of the substrate contact semiconductor region 32 may be from about 30 nm to about 400 nm, and typically from about 100 nm to about 200 nm, although lesser and greater depths are also contemplated herein. Typically, the substrate contact semiconductor region 32 is heavily doped, i.e., have a dopant concentration from about $3.0 \times 10^{19}/cm^3$ to about $3.0 \times 10^{21}/cm^3$.

Figure 21:
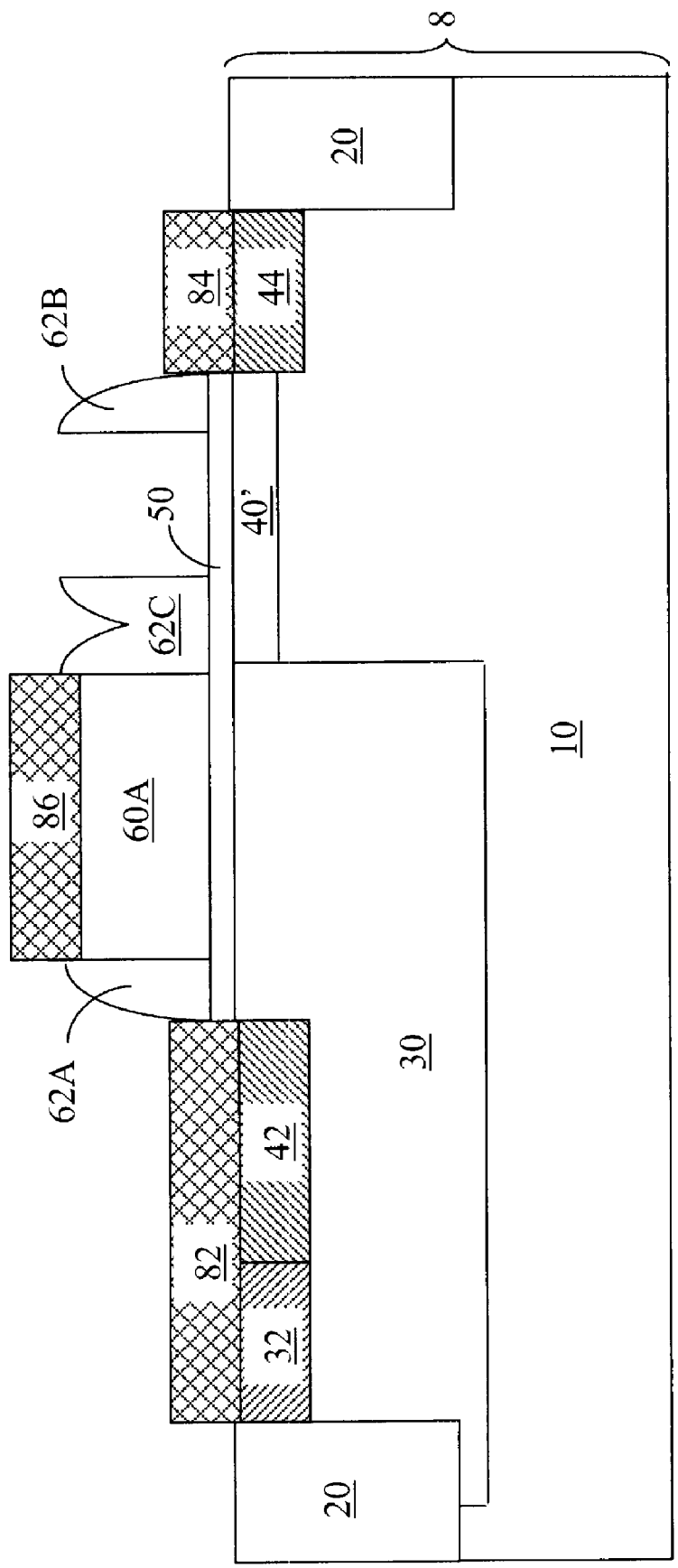
Figure 21A:
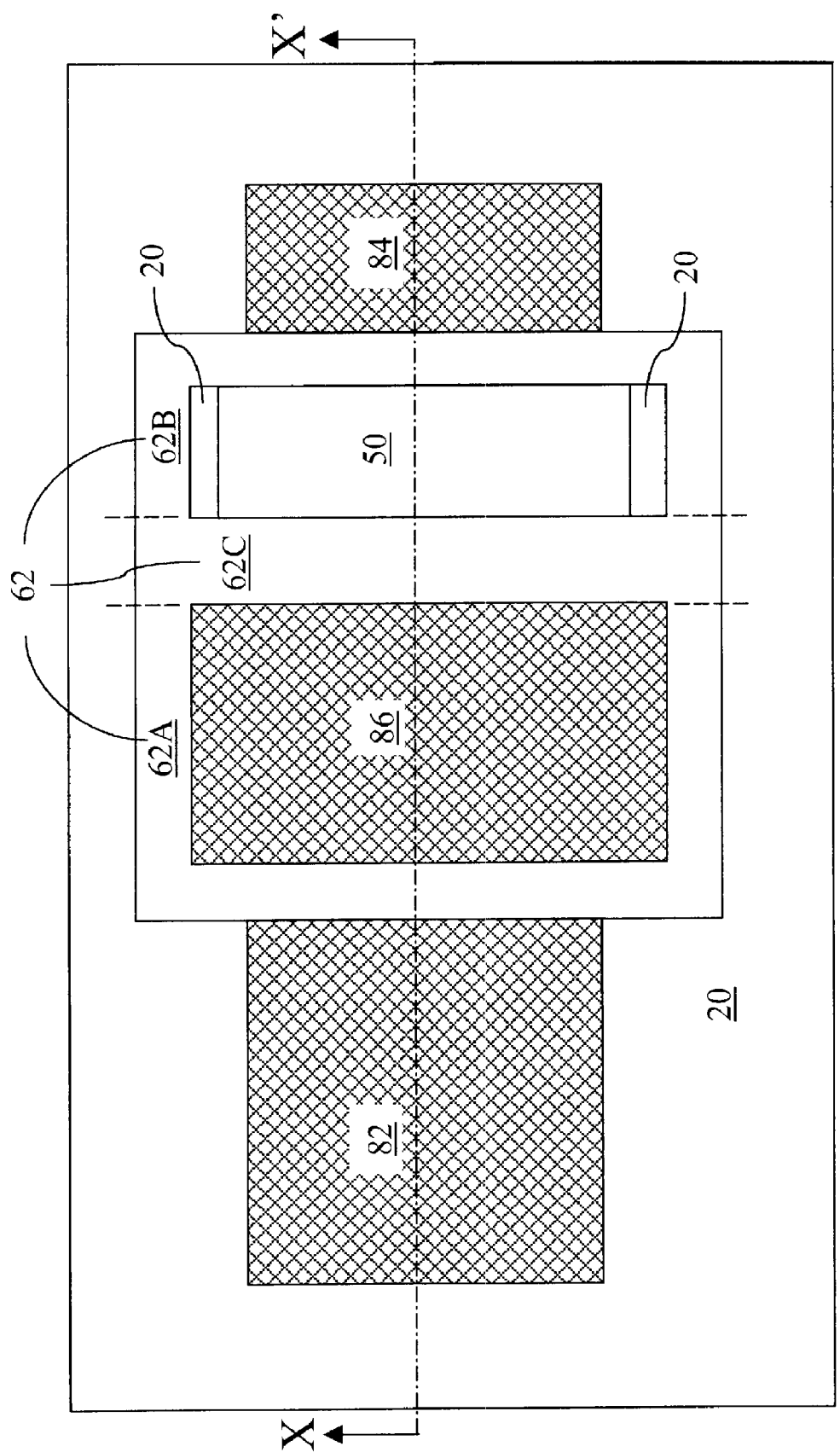

Referring to FIGS. 21 and 21A, various metal semiconductor alloys are formed on exposed semiconductor surfaces. Specifically, a source and substrate metal contact 82 and a drain metal contact 84, which comprise a metal semiconductor alloy derived from the semiconductor material of the semiconductor substrate 8, are formed over the first conductivity type well 30 and over the drift region 40, respectively. A gate metal contact 86, which comprises a metal semiconductor alloy derived from the material comprising the gate electrode 60, is formed on the gate electrode 60. In case the semiconductor substrate 8 or the gate electrode 60 comprises silicon, the corresponding metal silicide alloy is a metal silicide.

Figure 22:
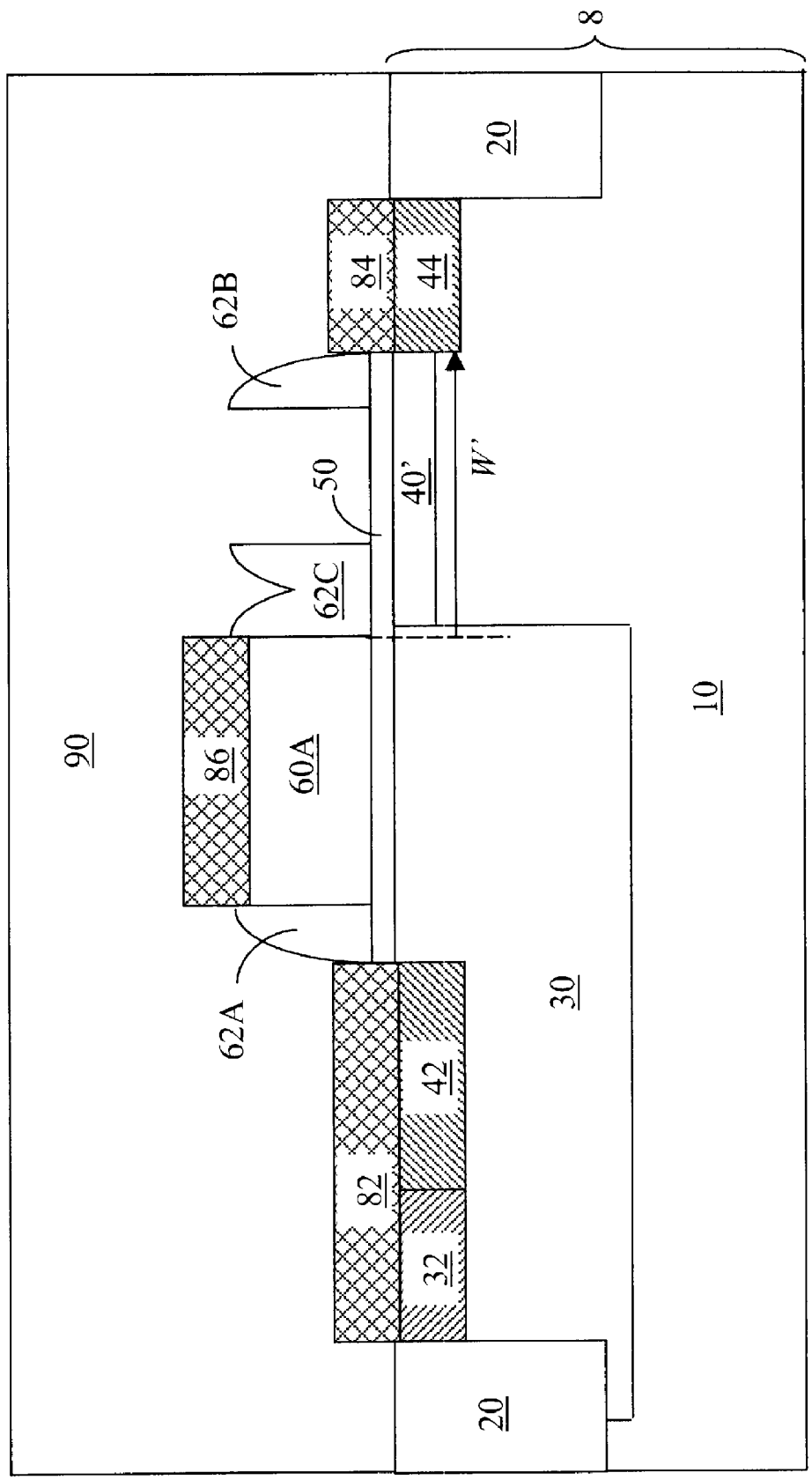

Referring to FIG. 22, a dielectric material layer 90 is deposited over the dielectric gate spacer (62A, 62B, 62C), the source and substrate metal contact 82, the drain metal contact 84, and the gate metal contact 86. The dielectric material layer 90 may comprise silicon oxide, silicon nitride, a low-k dielectric material such as an organosilicate glass (OSG), a spin-on low-k dielectric material, or a combination thereof. A low-k dielectric material herein denotes a dielectric material having a dielectric constant of 2.5 or less.

The second exemplary semiconductor structure is a lateral diffusion metal oxide semiconductor field effect transistor (LDMOSFET) which comprises:

a first conductivity type well 30 having a doping of a first conductivity type and located in a semiconductor substrate 8;

a drift region 40' having a doping of a second conductivity type which is the opposite of the first conductivity type, and located in the semiconductor substrate 8;

a source region 42 having a doping of the second conductivity type and located in the first conductivity type well 30;

a drain region 44 having a doping of the second conductivity type, laterally abutting the drift region 40', and located in the semiconductor substrate 8;

a gate dielectric 50 vertically abutting the first conductivity type well 30 and the drift region 40';

a gate electrode 60A vertically abutting the gate dielectric 50 and straddling over the first conductivity type well 30 and the drift region 40';

a dielectric gate spacer (60A, 60B, 60C) of unitary construction and containing two holes, wherein a first hole is filled by the gate electrode 60A, and wherein a second hole is filled with a dielectric material of a dielectric material layer 90;

a substrate contact semiconductor region 32 having a doping of the first conductivity type and located in the semiconductor substrate 8, wherein the substrate contact semiconductor region 32 laterally abuts the source region 42;

a source and substrate metal contact 82 vertically abutting the source region 42 and the substrate contact semiconductor region 32; and a substrate layer 10 having a doping of the first conductivity type, abutting the first conductivity type well 30 and the drift region 40', located in the semiconductor substrate 8, and having a lower doping concentration than the first conductivity type well 30.

The lateral distance W', or the offset, between the gate electrode 60 and the drain region 44 is not determined by a lithographic process, but is determined by the placement of the disposable conductive portion 60B and the thickness, or the lateral width, of the dielectric gate spacer second portion 62B. Thus, a tighter distribution of the lateral distance W' is achieved since the lateral distance W' is not dependent of any lithographic overlay tolerance, but is affected only by a variation in the thickness of the dielectric gate spacer second portion 62B. Thus, a tighter control is provided on the resistance of the drift region 40, which is advantageously employed to provide a higher performance or a lower power consumption of the inventive lateral diffusion metal oxide semiconductor field effect transistor (LDMOSFET) compared to prior art devices providing a similar functionality.

Figure 23:
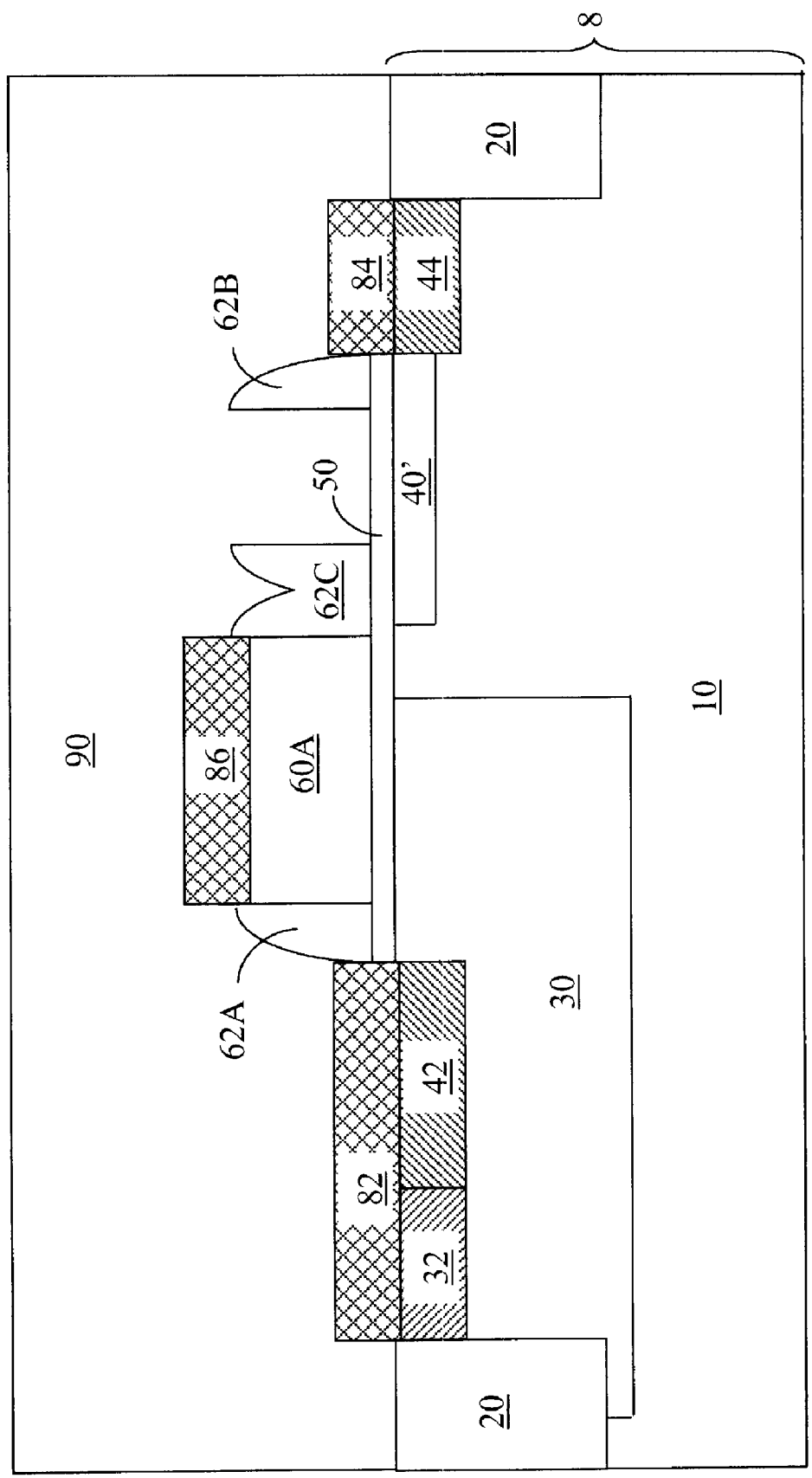
FIG. 23 is a vertical cross-sectional views of a variation of the second exemplary semiconductor structure.

Referring to FIG. 23, a variation of the second exemplary semiconductor structure is provided, in which a first conductivity type well 30 and a drift region 40' are separated from each other by a portion of the substrate semiconductor region 10. The same processing steps may be employed as on the first exemplary semiconductor structure except for modification of angled implantation steps employed to form the first conductivity type well 30 and the drift region 40' such that lateral extension of the first conductivity type well 30 and/or the drift region 40' is altered to induce the separation of the first conductivity type well 30 and the drift region 40'.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method manufacturing a semiconductor structure comprising:

forming a gate dielectric and a gate electrode on a semiconductor substrate including a substrate semiconductor region having a doping of a first conductivity type, wherein said gate dielectric contacts said substrate semiconductor region;

forming a drift region having a doping of a second conductivity type on a drain side of said gate electrode by implanting dopants of said second conductivity type into a portion of said substrate semiconductor region, wherein said second conductivity type is the opposite of said first conductivity type;

forming a first gate spacer on sidewalls of said gate electrode, wherein said first gate spacer is not present above said gate electrode;

forming a second gate spacer laterally surrounding said first gate spacer on said first gate spacer and on a surface of said drift region;

removing a first portion of said second gate spacer on a source side of said gate electrode;

forming a source region having a doping of said second conductivity type in said remaining substrate semiconductor region within said semiconductor substrate on said source side of said gate electrode after removal of said first portion of said second gate spacer;

forming a drain region having a doping of said second conductivity type within said drift region in said semiconductor substrate on said drain side of said gate electrode, wherein said drain region is spaced from said remaining substrate semiconductor region; and removing a second portion of said second gate spacer on said drain side of said gate electrode after formation of said drain region.

2. The method of claim 1, wherein an edge of said source region is substantially coincident with an outer sidewall of said first gate spacer.

3. The method of claim 1, wherein an edge of said drain region is substantially coincident with an outer sidewall of said second gate spacer.

4. The method of claim 1, further comprising forming a dielectric cap directly on said gate electrode, wherein said dielectric cap and said gate electrode have vertically coincident sidewalls.

5. The method of claim 4, wherein said second gate spacer is formed on directly on said dielectric cap, and wherein said dielectric cap comprises borophosphosilicate glass (BPSG).

6. The method of claim 1, wherein said second gate spacer comprises a material selected from germanium, a silicon germanium alloy containing germanium at an atomic concentration of 25% or greater, an anti-reflective coating material, and silicon oxide containing hydrogen at an atomic concentration of 1.0% or greater.

7. The method of claim 1, wherein an edge of said substrate contact semiconductor region is substantially coincident with an outer sidewall of said second gate spacer, wherein said source region laterally contacts said substrate contact semiconductor region.

8. The method of claim 7, further comprising:
forming a first conductivity type well having a doping of said first conductivity type underneath a source side edge of said gate electrode in said semiconductor substrate; and
forming a drift region having a doping of said second conductivity type underneath a drain side edge of said gate electrode in said semiconductor substrate.

9. The method of claim 8, wherein a first lateral distance between said substrate contact semiconductor region and said gate electrode is the same as a second lateral distance between said drain region and said gate electrode.

10. The method of claim 8, wherein said drift region abuts said gate dielectric, and said drain region is formed within said drift region and has a doping of said second conductivity type.

11. The method of claim 10, wherein said first conductivity type well abuts said gate dielectric, wherein said source region contacts said first conductivity type well and has a doping of said second conductivity type.

12. The method of claim 1, wherein an interface between a remaining substrate semiconductor region and said drift region is in contact with a bottom surface of said gate dielectric.

* * * * *